United States Patent
Mehta et al.

(10) Patent No.: US 11,284,218 B2
(45) Date of Patent: Mar. 22, 2022

(54) MULTI-PATH POSITIONING SIGNAL DETERMINATION

(71) Applicant: QUALCOMM Incorporated, San Diego, CA (US)

(72) Inventors: Chandrakant Mehta, Cupertino, CA (US); Gautam Nirula, Santa Clara, CA (US); William Morrison, San Francisco, CA (US); Grant Marshall, Campbell, CA (US); Guttorm Ringstad Opshaug, Redwood City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/841,726

(22) Filed: Apr. 7, 2020

(65) Prior Publication Data

US 2021/0314734 A1    Oct. 7, 2021

(51) Int. Cl.
*H04W 4/029* (2018.01)
*G01R 33/02* (2006.01)
*G01P 13/00* (2006.01)
*G01S 5/02* (2010.01)

(52) U.S. Cl.
CPC ............ *H04W 4/029* (2018.02); *G01P 13/00* (2013.01); *G01R 33/02* (2013.01); *G01S 5/0263* (2013.01); *G01S 5/0273* (2013.01)

(58) Field of Classification Search
CPC ........ H04W 4/029; G01P 13/00; G01R 33/02; G01S 5/0263; G01S 5/0273
USPC ...................................................... 455/456.1
See application file for complete search history.

(56) References Cited

U.S. PATENT DOCUMENTS

| 2009/0141779 | A1  | 6/2009 | Murakami |
| 2018/0011200 | A1  | 1/2018 | Ramamurthy et al. |
| 2018/0188381 | A1  | 7/2018 | Zhang et al. |
| 2019/0141635 | A1* | 5/2019 | Raghupathy .............. G01S 5/10 |

FOREIGN PATENT DOCUMENTS

JP    2011053166 A    3/2011

OTHER PUBLICATIONS

International Search Report and Written Opinion—PCT/US2021/025533—ISA/EPO—dated Jun. 21, 2021.

* cited by examiner

*Primary Examiner* — Charles N Appiah
*Assistant Examiner* — Frank E Donado
(74) *Attorney, Agent, or Firm* — Thien T. Nguyen

(57) ABSTRACT

A UE includes: at least one sensor configured to provide at least one sensor measurement; and a processor configured to: determine first and second ranges between the UE and a positioning signal source based on first and second positioning signal measurements of first and second positioning signals from the positioning signal source corresponding to first and second times; determine whether a selected range of the first range or the second range is a multipath range based on the first range, the second range, and movement of the UE between the first time and the second time indicated by the at least one sensor measurement; and discount use of the selected range in a positioning technique in response to the selected range being determined to be a multipath range.

26 Claims, 8 Drawing Sheets

|  | SV 190 | SV 191 | SV 192 | SV 193 |
|---|---|---|---|---|
| Measured range at point 430 | 21,016 | 20,496 | 21,533 | 21,272 |
| Displacement vector (lat., long., alt.) | 35, 12, 0 | 35, 12, 0 | 35, 12, 0 | 35, 12, 0 |
| Displacement relative to SV | -35 | 7 | 25 | 14 |
| Expected range at point 432 | 20,981 | 20,503 | 21,558 | 21,286 |
| Measured range at point 432 | 21,024 | 20,503 | 21,558 | 21,271 |
| Delta, measured to expected, point 432 | 43 | 0 | 0 | -13 |

|  | SV 190 | SV 191 | SV 192 | SV 193 |
|---|---|---|---|---|
| Measured range at point 430 | 21,016 | 20,496 | 21,533 | 21,272 |
| Displacement magnitude | 37 | 37 | 37 | 37 |
| Expected range at point 432 | 20,979 - 21,053 | 20,459 - 20,533 | 21,496 - 21,570 | 21,235 - 21,307 |
| Measured range at point 432 | 21,024 | 20,503 | 21,558 | 21,271 |
| Delta, measured to expected, point 432 | in window | in window | in window | in window |

MULTI-PATH POSITIONING SIGNAL DETERMINATION

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., Long Term Evolution (LTE) or WiMax). There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Time Division Multiple Access (TDMA), the Global System for Mobile access (GSM) variation of TDMA, etc.

A fifth generation (5G) mobile standard calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

Obtaining the location or position of a mobile device that is accessing a wireless network may be useful for many applications including, for example, emergency calls, personal navigation, asset tracking, locating a friend or family member, etc. Existing position methods include methods based on measuring radio signals transmitted from a variety of devices including satellite vehicles (SVs) and terrestrial radio sources in a wireless network such as base stations and access points. It is expected that standardization for the 5G wireless networks will include support for various positioning methods, which may utilize reference signals transmitted by base stations in a manner similar to which LTE wireless networks currently utilize Positioning Reference Signals (PRS) and/or Cell-specific Reference Signals (CRS) for position determination.

Urban areas experience higher position determination errors due to multipath travel of positioning signals from positioning signal sources to receivers and/or blockage of positioning signals. To mitigate the effects of multipath travel of positioning signals, different measurement techniques, e.g., longer measurement times, may be used to attempt to improve signal quality of the positioning signals measurements of which are used in determining position.

SUMMARY

An example user equipment (UE) includes: a receiver configured to receive positioning signals; at least one sensor configured to provide at least one sensor measurement independent of the positioning signals; a memory; and a processor communicatively coupled to the receiver, the memory, and the at least one sensor, the processor being configured to: determine a first range between the UE and a positioning signal source based on a first positioning signal measurement of a first positioning signal from the positioning signal source corresponding to a first time; determine a second range between the UE and the positioning signal source based on a second positioning signal measurement of a second positioning signal from the positioning signal source corresponding to a second time; determine whether a selected range of the first range or the second range is a multipath range based on the first range, the second range, and movement of the UE between the first time and the second time indicated by the at least one sensor measurement; and discount use of the selected range in a positioning technique, for determining location of the UE, in response to the selected range being determined to be a multipath range.

Implementations of such a UE may include one or more of the following features. To determine whether the selected range is a multipath range the processor is at least one of: configured to determine whether an expected range differs from the second range by more than a first threshold amount, the expected range being based on the first range and a displacement of the UE between the first time and the second time, the displacement being based on the at least one sensor measurement; or configured to determine whether a difference between the first range and the second range exceeds the displacement of the UE between the first time and the second time by more than a second threshold amount. To determine whether the selected range is a multipath range the processor is configured to determine a magnitude of the displacement of the UE based on the at least one sensor measurement. To determine whether the selected range is a multipath range the processor is configured to determine a direction of the displacement of the UE based on the at least one sensor measurement.

Also or alternatively, implementations of such a UE may include one or more of the following features. The at least one sensor includes one or more inertial motion sensors. The at least one sensor includes at least one camera and the at least one sensor measurement includes a plurality of images captured by the at least one camera, or the at least one sensor includes at least one magnetometer and the at least one sensor measurement includes one or more magnetic field measurements, or a combination thereof. To discount use of the selected range in the positioning technique the processor is at least one of: configured to exclude use of the selected range in the positioning technique; or configured to reduce a weighting of the selected range in the positioning technique. The processor is configured to: determine a presently-determined location of the UE in accordance with the positioning technique with the selected range discounted; and replace a previously-determined location of the UE with the presently-determined location of the UE. The processor is further configured to discount use of a third positioning signal measurement of a third positioning signal from the positioning signal source, for determining another location of the UE, in response to the selected range being determined to be a multipath range.

An example of a method of assisting a positioning technique includes: measuring, at a user equipment (UE), a first positioning signal from a positioning signal source corresponding to a first time to produce a first positioning signal measurement; measuring, at the UE, a second positioning signal from the positioning signal source corresponding to a second time to produce a second positioning signal measurement; determining a first range between the UE and the positioning signal source based on the first positioning signal measurement; determining a second range between the UE and the positioning signal source based on the second positioning signal measurement; obtaining at least one sensor measurement, from at least one sensor of the UE, indicative of movement of the UE between the first time and the second time; determining that a selected range of the first range or the second range is a multipath range based on the first range, the second range, and the at least one sensor measurement; and discounting use of the selected range in the positioning technique, for determining location of the UE, in response to the selected range being determined to be a multipath range.

Implementations of such a method may include one or more of the following features. Determining that the selected range is a multipath range includes at least one of: determining that an expected range differs from the second range by more than a first threshold amount, the expected range being based on the first range and a displacement of the UE between the first time and the second time, the displacement being based on the at least one sensor measurement; or determining that a difference between the first range and the second range exceeds the displacement of the UE between the first time and the second time by more than a second threshold amount. Determining that the selected range is a multipath range includes determining a magnitude of the displacement of the UE based on the at least one sensor measurement. Determining that the selected range is a multipath range includes determining a direction of the displacement of the UE based on the at least one sensor measurement.

Also or alternatively, implementations of such a method may include one or more of the following features. The at least one sensor measurement includes one or more inertial motion measurements. Obtaining the at least one sensor measurement includes: capturing a plurality of images by at least one camera of the UE; or making one or more magnetic field measurements; or a combination thereof. Discounting use of the selected range in the positioning technique includes at least one of: excluding use of the selected range in the positioning technique; or reducing a weighting of the selected range in the positioning technique. The method includes: determining a presently-determined location of the UE in accordance with the positioning technique with the selected range discounted; and replacing a previously-determined location of the UE with the presently-determined location of the UE. The method includes discounting use of a third positioning signal measurement of a third positioning signal from the positioning signal source, for determining another location of the UE, in response to the selected range being determined to be a multipath range.

Another example UE includes: means for measuring a first positioning signal from a positioning signal source corresponding to a first time to produce a first positioning signal measurement; means for measuring a second positioning signal from the positioning signal source corresponding to a second time to produce a second positioning signal measurement; means for determining a first range between the UE and the positioning signal source based on the first positioning signal measurement; means for determining a second range between the UE and the positioning signal source based on the second positioning signal measurement; means for obtaining at least one sensor measurement, from at least one sensor of the UE, indicative of movement of the UE between the first time and the second time; means for determining whether a selected range of the first range or the second range is a multipath range based on the first range, the second range, and the at least one sensor measurement; and means for discounting use of the selected range in a positioning technique, for determining location of the UE, in response to the selected range being determined to be a multipath range.

Implementations of such a UE may include one or more of the following features. The means for determining whether the selected range is a multipath range include at least one of: means for determining whether an expected range differs from the second range by more than a first threshold amount, the expected range being based on the first range and a displacement of the UE between the first time and the second time, the displacement being based on the at least one sensor measurement; or means for determining whether a difference between the first range and the second range exceeds the displacement of the UE between the first time and the second time by more than a second threshold amount. The means for determining whether the selected range is a multipath range include means for determining a magnitude of the displacement of the UE based on the at least one sensor measurement. The means for determining whether the selected range is a multipath range include means for determining a direction of the displacement of the UE based on the at least one sensor measurement.

Also or alternatively, implementations of such a UE may include one or more of the following features. The means for obtaining the at least one sensor measurement include one or more inertial motion measurements. The means for obtaining the at least one sensor measurement include: at least one camera of the UE; or at least one magnetometer; or a combination thereof. The means for discounting use of the selected range in the positioning technique include at least one of: mans for excluding use of the selected range in the positioning technique; or means for reducing a weighting of the selected range in the positioning technique. The UE includes: means for determining a presently-determined location of the UE in accordance with the positioning technique with the selected range discounted; and means for replacing a previously-determined location of the UE with the presently-determined location of the UE. The UE includes means for discounting use of a third positioning signal measurement of a third positioning signal from the positioning signal source, for determining another location of the UE, in response to the selected range being determined to be a multipath range.

An example of a non-transitory, processor-readable storage medium includes instructions configured to cause one or more processors to: determine a first range between a user equipment (UE) and a positioning signal source based on a first positioning signal measurement at the UE of a first positioning signal from the positioning signal source corresponding to a first time; determine a second range between the UE and the positioning signal source based on a second positioning signal measurement at the UE of a second positioning signal from the positioning signal source corresponding to a second time; obtain at least one sensor measurement, from at least one sensor of the UE, indicative of movement of the UE between the first time and the second time; determine whether a selected range of the first range or the second range is a multipath range based on the first range, the second range, and the at least one sensor measurement; and discount use of the selected range in a positioning technique, for determining location of the UE, in response to the selected range being determined to be a multipath range.

Implementations of such a storage medium may include one or more of the following features. The instructions are configured to cause the one or more processors to determine whether the selected range is a multipath range include at least one of: instructions configured to cause the one or more processors to determine whether an expected range differs from the second range by more than a first threshold amount, the expected range being based on the first range and a displacement of the UE between the first time and the second time, the displacement being based on the at least one sensor measurement; or instructions configured to cause the one or more processors to determine whether a difference between the first range and the second range exceeds the displacement of the UE between the first time and the second time by more than a second threshold amount. The instructions are configured to cause the one or more processors to determine whether the selected range is a multipath range include instructions configured to cause the one or more processors to determine a magnitude of the displacement of the UE based on the at least one sensor measurement. The instructions are configured to cause the one or more processors to determine whether the selected range is a multipath range include instructions configured to cause the one or more processors to determine a direction of the displacement of the UE based on the at least one sensor measurement.

Also or alternatively, implementations of such a storage medium may include one or more of the following features. The at least one sensor measurement includes one or more inertial motion measurements. The instructions are configured to cause the one or more processors to discount use of the selected range in the positioning technique include at least one of: instructions configured to cause the one or more processors to exclude use of the selected range in the positioning technique; or instructions configured to cause the one or more processors to reduce a weighting of the selected range in the positioning technique. The instructions are configured to cause the one or more processors to discount use of a third positioning signal measurement of a third positioning signal from the positioning signal source, for determining another location of the UE, in response to the selected range being determined to be a multipath range.

DETAILED DESCRIPTION

Figure 1:
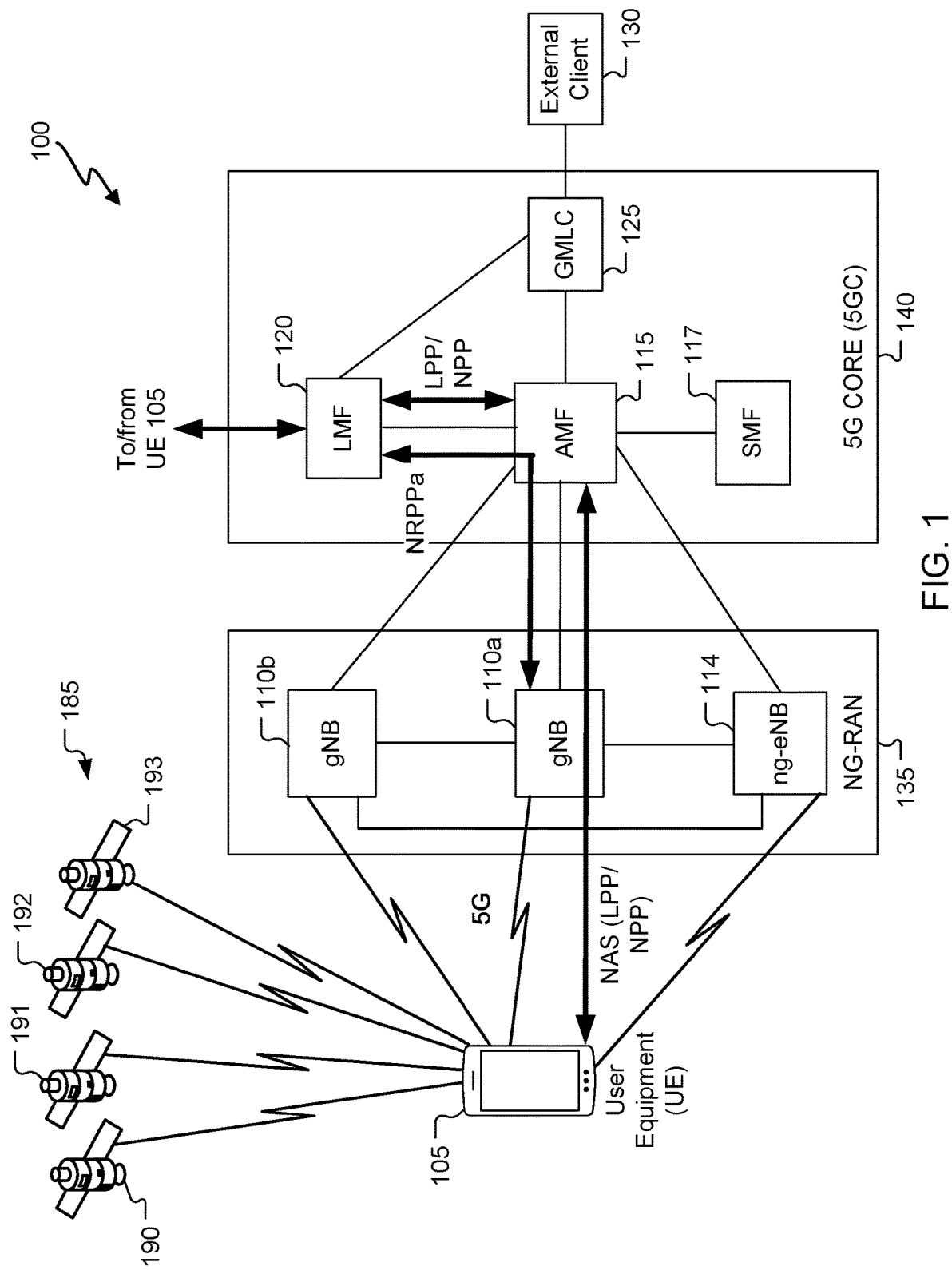
FIG. 1 is a simplified diagram of an example wireless communications system in accordance with the disclosure.

Techniques are discussed herein for determining a location of user equipment. For example, a user equipment (UE) may measure a first set of positioning signals from corresponding positioning signal sources such as satellite vehicles (SVs) and/or base stations. The UE may move and measure a second set of positioning signals from corresponding positioning signal sources. One or more of the positioning signal sources corresponding to the first and second sets of positioning signals is(are) the same positioning signal source(s). The UE may capture information regarding movement of the UE between measuring the first and second sets of positioning signals. For example, the UE may take inertial motion measurements, magnetic field measurements (e.g., of the Earth's magnetic field), and/or capture images by one or more cameras. Displacement of the UE between measuring the first and second sets of positioning signals, and one or more ranges to one or more corresponding positioning signal sources, may be used to determine whether at least one of the ranges is a multipath range, corresponding to a multipath signal. For example, the UE may determine expected ranges to the one or more positioning signal sources when measuring the second set of positioning signals. The expected range and measured range from any one of the second set of positioning signals may be compared. If the expected and measured range differs by more than a range threshold, then the UE may determine that the present positioning signal, or the previous positioning signal, was a multipath signal, or both positioning signals were multipath signals. For example, if the expected range exceeds the present measured range by more than the range threshold, then the UE may determine that at least the previous positioning signal from that source was a multipath signal. If the expected range is shorter than the present measured range by more than the range threshold, then the UE may determine that at least the present positioning signal is a multipath signal. As another example, a difference between two ranges may be compared to a displacement of the UE between times corresponding to the ranges. If the difference in the ranges differs from the displacement by more than a threshold amount, then at least one of the ranges may be determined to be a multipath range. Different thresholds may be used for the displacement being less than the range difference versus more than the range difference. Similarly, different thresholds may be used for the expected range being less than the actual range (or the actual range being more than the expected range) versus more than the actual range (or actual range being less than the expected range). A threshold may be relative (e.g., a percentage of the difference) or absolute (e.g., a distance such as a number of meters). Other examples may be used.

Items and/or techniques described herein may provide one or more of the following capabilities, as well as other capabilities not mentioned. For example, positioning accuracy may be improved by reducing the effect on the position determination of a multipath signal. A previously-determined position of a UE may be updated by reducing an effect of a multipath signal that was used to determine the position of the UE. Detection of multipath signals may be enabled and/or improved and appropriate action(s) taken.

Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

The description may refer to sequences of actions to be performed, for example, by elements of a computing device. Various actions described herein can be performed by specific circuits (e.g., an application specific integrated circuit (ASIC)), by program instructions being executed by one or more processors, or by a combination of both. Sequences of actions described herein may be embodied within a non-transitory computer-readable medium having stored thereon a corresponding set of computer instructions that upon execution would cause an associated processor to perform the functionality described herein. Thus, the various aspects described herein may be embodied in a number of different forms, all of which are within the scope of the disclosure, including claimed subject matter.

As used herein, the terms "user equipment" (UE) and "base station" are not specific to or otherwise limited to any particular Radio Access Technology (RAT), unless otherwise noted. In general, such UEs may be any wireless communication device (e.g., a mobile phone, router, tablet computer, laptop computer, tracking device, Internet of Things (IoT) device, etc.) used by a user to communicate over a wireless communications network. A UE may be mobile or may (e.g., at certain times) be stationary, and may communicate with a Radio Access Network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, WiFi networks (e.g., based on IEEE 802.11, etc.) and so on.

A base station may operate according to one of several RATs in communication with UEs depending on the network in which it is deployed, and may be alternatively referred to as an Access Point (AP), a Network Node, a NodeB, an evolved NodeB (eNB), a general Node B (gNodeB, gNB), etc. In addition, in some systems a base station may provide purely edge node signaling functions while in other systems it may provide additional control and/or network management functions.

UEs may be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

As used herein, the term "cell" or "sector" may correspond to one of a plurality of cells of a base station, or to the base station itself, depending on the context. The term "cell" may refer to a logical communication entity used for communication with a base station (for example, over a carrier), and may be associated with an identifier for distinguishing neighboring cells (for example, a physical cell identifier (PCID), a virtual cell identifier (VCID)) operating via the same or a different carrier. In some examples, a carrier may support multiple cells, and different cells may be configured according to different protocol types (for example, machine-type communication (MTC), narrowband Internet-of-Things (NB-IoT), enhanced mobile broadband (eMBB), or others) that may provide access for different types of devices. In some examples, the term "cell" may refer to a portion of a geographic coverage area (for example, a sector) over which the logical entity operates.

Referring to FIG. 1, an example of a communication system 100 includes a UE 105, a Radio Access Network (RAN) 135, here a Fifth Generation (5G) Next Generation (NG) RAN (NG-RAN), and a 5G Core Network (5GC) 140. The UE 105 may be, e.g., an IoT device, a location tracker device, a cellular telephone, or other device. A 5G network may also be referred to as a New Radio (NR) network; NG-RAN 135 may be referred to as a 5G RAN or as an NR RAN; and 5GC 140 may be referred to as an NG Core network (NGC). Standardization of an NG-RAN and 5GC is ongoing in the 3' Generation Partnership Project (3GPP). Accordingly, the NG-RAN 135 and the 5GC 140 may conform to current or future standards for 5G support from 3GPP. The RAN 135 may be another type of RAN, e.g., a 3G RAN, a 4G Long Term Evolution (LTE) RAN, etc. The communication system 100 may utilize information from a constellation 185 of satellite vehicles (SVs) 190, 191, 192, 193 for a Satellite Positioning System (SPS) (e.g., a Global Navigation Satellite System (GNSS)) like the Global Positioning System (GPS), the Global Navigation Satellite System (GLONASS), Galileo, or Beidou or some other local or regional SPS such as the Indian Regional Navigational Satellite System (IRNSS), the European Geostationary Navigation Overlay Service (EGNOS), or the Wide Area Augmentation System (WAAS).

Additional components of the communication system 100 are described below. The communication system 100 may include additional or alternative components.

As shown in FIG. 1, the NG-RAN 135 includes NR nodeBs (gNBs) 110a, 110b, and a next generation eNodeB (ng-eNB) 114, and the 5GC 140 includes an Access and Mobility Management Function (AMF) 115, a Session Management Function (SMF) 117, a Location Management Function (LMF) 120, and a Gateway Mobile Location Center (GMLC) 125. The gNBs 110a, 110b and the ng-eNB 114 are communicatively coupled to each other, are each configured to bi-directionally wirelessly communicate with the UE 105, and are each communicatively coupled to, and configured to bi-directionally communicate with, the AMF 115. The AMF 115, the SMF 117, the LMF 120, and the GMLC 125 are communicatively coupled to each other, and the GMLC is communicatively coupled to an external client 130. The SMF 117 may serve as an initial contact point of a Service Control Function (SCF) (not shown) to create, control, and delete media sessions.

FIG. 1 provides a generalized illustration of various components, any or all of which may be utilized as appropriate, and each of which may be duplicated or omitted as necessary. Specifically, although only one UE 105 is illustrated, many UEs (e.g., hundreds, thousands, millions, etc.) may be utilized in the communication system 100. Similarly, the communication system 100 may include a larger (or smaller) number of SVs (i.e., more or fewer than the four SVs 190-193 shown), gNBs 110*a*, 110*b*, ng-eNBs 114, AMFs 115, external clients 130, and/or other components. The illustrated connections that connect the various components in the communication system 100 include data and signaling connections which may include additional (intermediary) components, direct or indirect physical and/or wireless connections, and/or additional networks. Furthermore, components may be rearranged, combined, separated, substituted, and/or omitted, depending on desired functionality.

While FIG. 1 illustrates a 5G-based network, similar network implementations and configurations may be used for other communication technologies, such as 3G, Long Term Evolution (LTE), etc. Implementations described herein (be they for 5G technology and/or for one or more other communication technologies and/or protocols) may be used to transmit (or broadcast) directional synchronization signals, receive and measure directional signals at UEs (e.g., the UE 105) and/or provide location assistance to the UE 105 (via the GMLC 125 or other location server) and/or compute a location for the UE 105 at a location-capable device such as the UE 105, the gNB 110*a*, 110*b*, or the LMF 120 based on measurement quantities received at the UE 105 for such directionally-transmitted signals. The gateway mobile location center (GMLC) 125, the location management function (LMF) 120, the access and mobility management function (AMF) 115, the SMF 117, the ng-eNB (eNodeB) 114 and the gNBs (gNodeBs) 110*a*, 110*b* are examples and may, in various embodiments, be replaced by or include various other location server functionality and/or base station functionality respectively.

The UE 105 may comprise and/or may be referred to as a device, a mobile device, a wireless device, a mobile terminal, a terminal, a mobile station (MS), a Secure User Plane Location (SUPL) Enabled Terminal (SET), or by some other name. Moreover, the UE 105 may correspond to a cellphone, smartphone, laptop, tablet, PDA, tracking device, navigation device, Internet of Things (IoT) device, asset tracker, health monitors, security systems, smart city sensors, smart meters, wearable trackers, or some other portable or moveable device. Typically, though not necessarily, the UE 105 may support wireless communication using one or more Radio Access Technologies (RATs) such as Global System for Mobile communication (GSM), Code Division Multiple Access (CDMA), Wideband CDMA (WCDMA), LTE, High Rate Packet Data (HRPD), IEEE 802.11 WiFi (also referred to as Wi-Fi), Bluetooth® (BT), Worldwide Interoperability for Microwave Access (WiMAX), 5G new radio (NR) (e.g., using the NG-RAN 135 and the 5GC 140), etc. The UE 105 may support wireless communication using a Wireless Local Area Network (WLAN) which may connect to other networks (e.g., the Internet) using a Digital Subscriber Line (DSL) or packet cable, for example. The use of one or more of these RATs may allow the UE 105 to communicate with the external client 130 (e.g., via elements of the 5GC 140 not shown in FIG. 1, or possibly via the GMLC 125) and/or allow the external client 130 to receive location information regarding the UE 105 (e.g., via the GMLC 125).

The UE 105 may include a single entity or may include multiple entities such as in a personal area network where a user may employ audio, video and/or data I/O (input/output) devices and/or body sensors and a separate wireline or wireless modem. An estimate of a location of the UE 105 may be referred to as a location, location estimate, location fix, fix, position, position estimate, or position fix, and may be geographic, thus providing location coordinates for the UE 105 (e.g., latitude and longitude) which may or may not include an altitude component (e.g., height above sea level, height above or depth below ground level, floor level, or basement level). Alternatively, a location of the UE 105 may be expressed as a civic location (e.g., as a postal address or the designation of some point or small area in a building such as a particular room or floor). A location of the UE 105 may be expressed as an area or volume (defined either geographically or in civic form) within which the UE 105 is expected to be located with some probability or confidence level (e.g., 67%, 95%, etc.). A location of the UE 105 may be expressed as a relative location comprising, for example, a distance and direction from a known location. The relative location may be expressed as relative coordinates (e.g., X, Y (and Z) coordinates) defined relative to some origin at a known location which may be defined, e.g., geographically, in civic terms, or by reference to a point, area, or volume, e.g., indicated on a map, floor plan, or building plan. In the description contained herein, the use of the term location may comprise any of these variants unless indicated otherwise. When computing the location of a UE, it is common to solve for local x, y, and possibly z coordinates and then, if desired, convert the local coordinates into absolute coordinates (e.g., for latitude, longitude, and altitude above or below mean sea level).

The UE 105 may be configured to communicate with other entities using one or more of a variety of technologies. The UE 105 may be configured to connect indirectly to one or more communication networks via one or more device-to-device (D2D) peer-to-peer (P2P) links. The D2D P2P links may be supported with any appropriate D2D radio access technology (RAT), such as LTE Direct (LTE-D), WiFi Direct (WiFi-D), Bluetooth®, and so on. One or more of a group of UEs utilizing D2D communications may be within a geographic coverage area of a Transmission/Reception Point (TRP) such as one or more of the gNBs 110*a*, 110*b*, and/or the ng-eNB 114. Other UEs in such a group may be outside such geographic coverage areas, or may be otherwise unable to receive transmissions from a base station. Groups of UEs communicating via D2D communications may utilize a one-to-many (1:M) system in which each UE may transmit to other UEs in the group. A TRP may facilitate scheduling of resources for D2D communications. In other cases, D2D communications may be carried out between UEs without the involvement of a TRP.

Base stations (BSs) in the NG-RAN 135 shown in FIG. 1 include NR Node Bs, referred to as the gNBs 110*a* and 110*b*. Pairs of the gNBs 110*a*, 110*b* in the NG-RAN 135 may be connected to one another via one or more other gNBs. Access to the 5G network is provided to the UE 105 via wireless communication between the UE 105 and one or more of the gNBs 110*a*, 110*b*, which may provide wireless communications access to the 5GC 140 on behalf of the UE 105 using 5G. In FIG. 1, the serving gNB for the UE 105 is assumed to be the gNB 110*a*, although another gNB (e.g. the gNB 110*b*) may act as a serving gNB if the UE 105 moves to another location or may act as a secondary gNB to provide additional throughput and bandwidth to the UE 105.

Base stations (BSs) in the NG-RAN 135 shown in FIG. 1 may include the ng-eNB 114, also referred to as a next generation evolved Node B. The ng-eNB 114 may be connected to one or more of the gNBs 110*a*, 110*b* in the NG-RAN 135, possibly via one or more other gNBs and/or one or more other ng-eNBs. The ng-eNB 114 may provide LTE wireless access and/or evolved LTE (eLTE) wireless access to the UE 105. One or more of the gNBs 110*a*, 110*b* and/or the ng-eNB 114 may be configured to function as positioning-only beacons which may transmit signals to assist with determining the position of the UE 105 but may not receive signals from the UE 105 or from other UEs.

The BSs 110*a*, 110*b*, 114 may each comprise one or more TRPs. For example, each sector within a cell of a BS may comprise a TRP, although multiple TRPs may share one or more components (e.g., share a processor but have separate antennas). The system 100 may include only macro TRPs or the system 100 may have TRPs of different types, e.g., macro, pico, and/or femto TRPs, etc. A macro TRP may cover a relatively large geographic area (e.g., several kilometers in radius) and may allow unrestricted access by terminals with service subscription. A pico TRP may cover a relatively small geographic area (e.g., a pico cell) and may allow unrestricted access by terminals with service subscription. A femto or home TRP may cover a relatively small geographic area (e.g., a femto cell) and may allow restricted access by terminals having association with the femto cell (e.g., terminals for users in a home).

As noted, while FIG. 1 depicts nodes configured to communicate according to 5G communication protocols, nodes configured to communicate according to other communication protocols, such as, for example, an LTE protocol or IEEE 802.11x protocol, may be used. For example, in an Evolved Packet System (EPS) providing LTE wireless access to the UE 105, a RAN may comprise an Evolved Universal Mobile Telecommunications System (UMTS) Terrestrial Radio Access Network (E-UTRAN) which may comprise base stations comprising evolved Node Bs (eNBs). A core network for EPS may comprise an Evolved Packet Core (EPC). An EPS may comprise an E-UTRAN plus EPC, where the E-UTRAN corresponds to the NG-RAN 135 and the EPC corresponds to the 5GC 140 in FIG. 1.

The gNBs 110*a*, 110*b* and the ng-eNB 114 may communicate with the AMF 115, which, for positioning functionality, communicates with the LMF 120. The AMF 115 may support mobility of the UE 105, including cell change and handover and may participate in supporting a signaling connection to the UE 105 and possibly data and voice bearers for the UE 105. The LMF 120 may communicate directly with the UE 105, e.g., through wireless communications. The LMF 120 may support positioning of the UE 105 when the UE 105 accesses the NG-RAN 135 and may support position procedures/methods such as Assisted GNSS (A-GNSS), Observed Time Difference of Arrival (OTDOA), Real Time Kinematics (RTK), Precise Point Positioning (PPP), Differential GNSS (DGNSS), Enhanced Cell ID (E-CID), angle of arrival (AOA), angle of departure (AOD), and/or other position methods. The LMF 120 may process location services requests for the UE 105, e.g., received from the AMF 115 or from the GMLC 125. The LMF 120 may be connected to the AMF 115 and/or to the GMLC 125. The LMF 120 may be referred to by other names such as a Location Manager (LM), Location Function (LF), commercial LMF (CLMF), or value added LMF (VLMF). A node/system that implements the LMF 120 may additionally or alternatively implement other types of location-support modules, such as an Enhanced Serving Mobile Location Center (E-SMLC) or a Secure User Plane Location (SUPL) Location Platform (SLP). At least part of the positioning functionality (including derivation of the UE 105's location) may be performed at the UE 105 (e.g., using signal measurements obtained by the UE 105 for signals transmitted by wireless nodes such as the gNBs 110*a*, 110*b* and/or the ng-eNB 114, and/or assistance data provided to the UE 105, e.g. by the LMF 120).

The GMLC 125 may support a location request for the UE 105 received from the external client 130 and may forward such a location request to the AMF 115 for forwarding by the AMF 115 to the LMF 120 or may forward the location request directly to the LMF 120. A location response from the LMF 120 (e.g., containing a location estimate for the UE 105) may be returned to the GMLC 125 either directly or via the AMF 115 and the GMLC 125 may then return the location response (e.g., containing the location estimate) to the external client 130. The GMLC 125 is shown connected to both the AMF 115 and LMF 120, though only one of these connections may be supported by the 5GC 140 in some implementations.

As further illustrated in FIG. 1, the LMF 120 may communicate with the gNBs 110*a*, 110*b* and/or hte ng-eNB 114 using a New Radio Position Protocol A (which may be referred to as NPPa or NRPPa), which may be defined in 3GPP Technical Specification (TS) 38.455. NRPPa may be the same as, similar to, or an extension of the LTE Positioning Protocol A (LPPa) defined in 3GPP TS 36.455, with NRPPa messages being transferred between the gNB 110*a* (or the gNB 110*b*) and the LMF 120, and/or between the ng-eNB 114 and the LMF 120, via the AMF 115. As further illustrated in FIG. 1, the LMF 120 and the UE 105 may communicate using an LTE Positioning Protocol (LPP), which may be defined in 3GPP TS 36.355. The LMF 120 and the UE 105 may also or instead communicate using a New Radio Positioning Protocol (which may be referred to as NPP or NRPP), which may be the same as, similar to, or an extension of LPP. Here, LPP and/or NPP messages may be transferred between the UE 105 and the LMF 120 via the AMF 115 and the serving gNB 110*a*, 110*b* or the serving ng-eNB 114 for the UE 105. For example, LPP and/or NPP messages may be transferred between the LMF 120 and the AMF 115 using a 5G Location Services Application Protocol (LCS AP) and may be transferred between the AMF 115 and the UE 105 using a 5G Non-Access Stratum (NAS) protocol. The LPP and/or NPP protocol may be used to support positioning of the UE 105 using UE-assisted and/or UE-based position methods such as A-GNSS, RTK, OTDOA and/or E-CID. The NRPPa protocol may be used to support positioning of the UE 105 using network-based position methods such as E-CID (e.g., when used with measurements obtained by the gNB 110*a*, 110*b* or the ng-eNB 114) and/or may be used by the LMF 120 to obtain location related information from the gNBs 110*a*, 110*b* and/or the ng-eNB 114, such as parameters defining directional SS transmissions from the gNBs 110*a*, 110*b*, and/or the ng-eNB 114.

With a UE-assisted position method, the UE 105 may obtain location measurements and send the measurements to a location server (e.g., the LMF 120) for computation of a location estimate for the UE 105. For example, the location measurements may include one or more of a Received Signal Strength Indication (RSSI), Round Trip signal propagation Time (RTT), Reference Signal Time Difference (RSTD), Reference Signal Received Power (RSRP) and/or Reference Signal Received Quality (RSRQ) for the gNBs 110*a*, 110*b*, the ng-eNB 114, and/or a WLAN AP. The location measurements may also or instead include measurements of GNSS pseudorange, code phase, and/or carrier phase for the SVs 190-193.

With a UE-based position method, the UE 105 may obtain location measurements (e.g., which may be the same as or similar to location measurements for a UE-assisted position method) and may compute a location of the UE 105 (e.g., with the help of assistance data received from a location server such as the LMF 120 or broadcast by the gNBs 110a, 110b, the ng-eNB 114, or other base stations or APs).

With a network-based position method, one or more base stations (e.g., the gNBs 110a, 110b, and/or the ng-eNB 114) or APs may obtain location measurements (e.g., measurements of RSSI, RTT, RSRP, RSRQ or Time Of Arrival (TOA) for signals transmitted by the UE 105) and/or may receive measurements obtained by the UE 105. The one or more base stations or APs may send the measurements to a location server (e.g., the LMF 120) for computation of a location estimate for the UE 105.

Information provided by the gNBs 110a, 110b, and/or the ng-eNB 114 to the LMF 120 using NRPPa may include timing and configuration information for directional SS transmissions and location coordinates. The LMF 120 may provide some or all of this information to the UE 105 as assistance data in an LPP and/or NPP message via the NG-RAN 135 and the 5GC 140.

An LPP or NPP message sent from the LMF 120 to the UE 105 may instruct the UE 105 to do any of a variety of things depending on desired functionality. For example, the LPP or NPP message could contain an instruction for the UE 105 to obtain measurements for GNSS (or A-GNSS), WLAN, E-CID, and/or OTDOA (or some other position method). In the case of E-CID, the LPP or NPP message may instruct the UE 105 to obtain one or more measurement quantities (e.g., beam ID, beam width, mean angle, RSRP, RSRQ measurements) of directional signals transmitted within particular cells supported by one or more of the gNBs 110a, 110b, and/or the ng-eNB 114 (or supported by some other type of base station such as an eNB or WiFi AP). The UE 105 may send the measurement quantities back to the LMF 120 in an LPP or NPP message (e.g., inside a 5G NAS message) via the serving gNB 110a (or the serving ng-eNB 114) and the AMF 115.

As noted, while the communication system 100 is described in relation to 5G technology, the communication system 100 may be implemented to support other communication technologies, such as GSM, WCDMA, LTE, etc., that are used for supporting and interacting with mobile devices such as the UE 105 (e.g., to implement voice, data, positioning, and other functionalities). In some such embodiments, the 5GC 140 may be configured to control different air interfaces. For example, the 5GC 140 may be connected to a WLAN using a Non-3GPP InterWorking Function (N3IWF, not shown FIG. 1) in the 5GC 150. For example, the WLAN may support IEEE 802.11 WiFi access for the UE 105 and may comprise one or more WiFi APs. Here, the N3IWF may connect to the WLAN and to other elements in the 5GC 140 such as the AMF 115. In some embodiments, both the NG-RAN 135 and the 5GC 140 may be replaced by one or more other RANs and one or more other core networks. For example, in an EPS, the NG-RAN 135 may be replaced by an E-UTRAN containing eNBs and the 5GC 140 may be replaced by an EPC containing a Mobility Management Entity (MME) in place of the AMF 115, an E-SMLC in place of the LMF 120, and a GMLC that may be similar to the GMLC 125. In such an EPS, the E-SMLC may use LPPa in place of NRPPa to send and receive location information to and from the eNBs in the E-UTRAN and may use LPP to support positioning of the UE 105. In these other embodiments, positioning of the UE 105 using directional PRSs may be supported in an analogous manner to that described herein for a 5G network with the difference that functions and procedures described herein for the gNBs 110a, 110b, the ng-eNB 114, the AMF 115, and the LMF 120 may, in some cases, apply instead to other network elements such eNBs, WiFi APs, an MME, and an E-SMLC.

As noted, in some embodiments, positioning functionality may be implemented, at least in part, using the directional SS beams, sent by base stations (such as the gNBs 110a, 110b, and/or the ng-eNB 114) that are within range of the UE whose position is to be determined (e.g., the UE 105 of FIG. 1). The UE may, in some instances, use the directional SS beams from a plurality of base stations (such as the gNBs 110a, 110b, the ng-eNB 114, etc.) to compute the UE's position.

Figure 2:
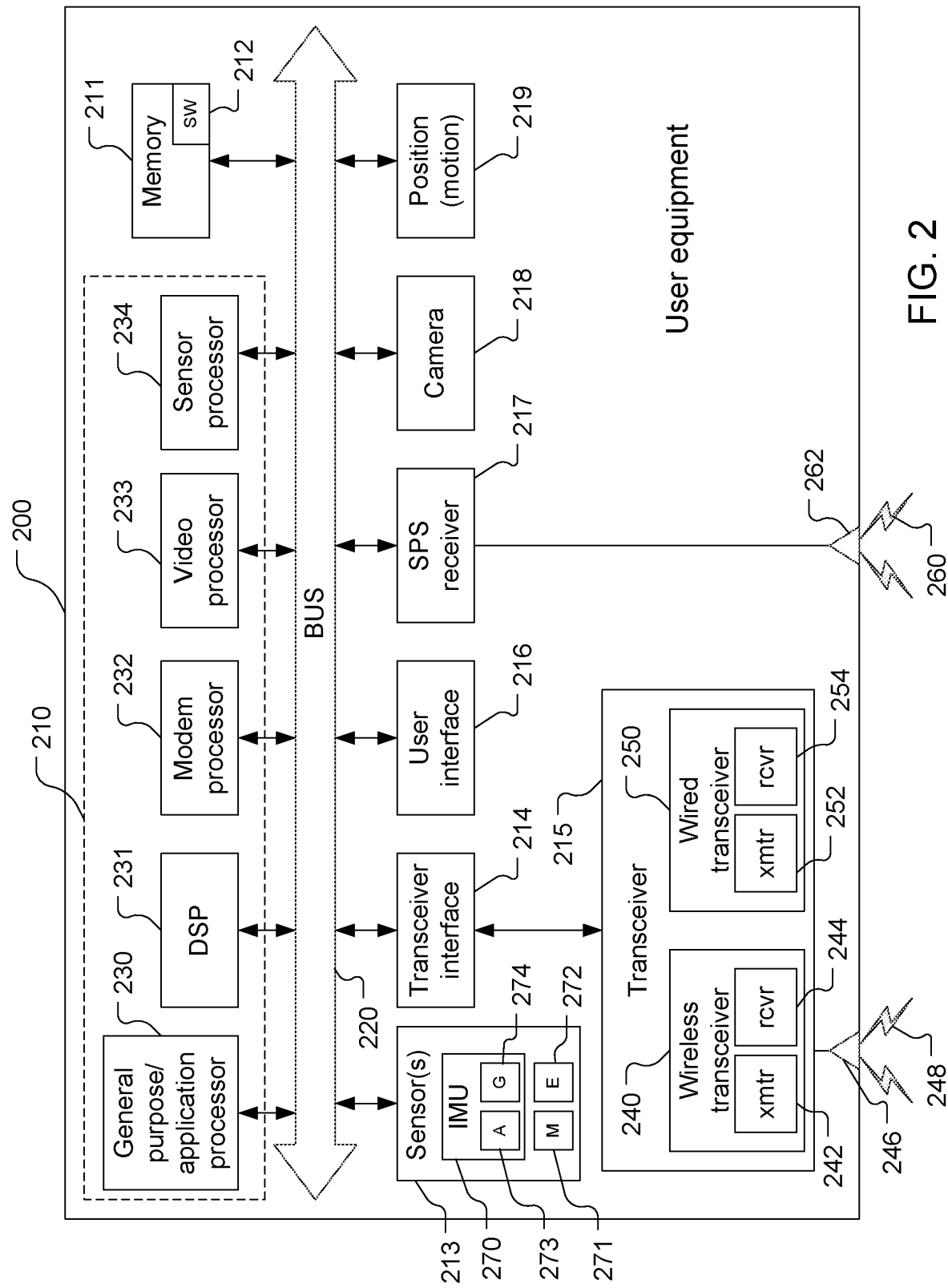
FIG. 2 is a block diagram of components of an example of a user equipment shown in FIG. 1.

Referring also to FIG. 2, a UE 200 is an example of the UE 105 and comprises a computing platform including a processor 210, memory 211 including software (SW) 212, one or more sensors 213, a transceiver interface 214 for a transceiver 215, a user interface 216, a Satellite Positioning System (SPS) receiver 217, a camera 218, and a position (motion) device (PMD) 219. The processor 210, the memory 211, the sensor(s) 213, the transceiver interface 214, the user interface 216, the SPS receiver 217, the camera 218, and the PMD 219 may be communicatively coupled to each other by a bus 220 (which may be configured, e.g., for optical and/or electrical communication). One or more of the shown apparatus (e.g., the camera 218, the PMD 219, and/or one or more of the sensor(s) 213, etc.) may be omitted from the UE 200. The processor 210 may include one or more intelligent hardware devices, e.g., a central processing unit (CPU), a microcontroller, an application specific integrated circuit (ASIC), etc. The processor 210 may comprise multiple processors including a general-purpose/application processor 230, a Digital Signal Processor (DSP) 231, a modem processor 232, a video processor 233, and/or a sensor processor 234. One or more of the processors 230-234 may comprise multiple devices (e.g., multiple processors). For example, the sensor processor 234 may comprise, e.g., processors for radar, ultrasound, and/or lidar, etc. The modem processor 232 may support dual SIM/dual connectivity (or even more SIMs). For example, a SIM (Subscriber Identity Module or Subscriber Identification Module) may be used by an Original Equipment Manufacturer (OEM), and another SIM may be used by an end user of the UE 200 for connectivity. The memory 211 is a non-transitory storage medium that may include random access memory (RAM), flash memory, disc memory, and/or read-only memory (ROM), etc. The memory 211 stores the software 212 which may be processor-readable, processor-executable software code containing instructions that are configured to, when executed, cause the processor 210 to perform various functions described herein. Alternatively, the software 212 may not be directly executable by the processor 210 but may be configured to cause the processor 210, e.g., when compiled and executed, to perform the functions. The description may refer only to the processor 210 performing a function, but this includes other implementations such as where the processor 210 executes software and/or firmware. The description may refer to the processor 210 performing a function as shorthand for one or more of the processors 230-234 performing the function. The description may refer to the UE 200 performing a function as shorthand for one or more appropriate components of the UE 200 performing the function. The processor 210 may include a memory with stored instructions in addition to and/or instead of the memory 211. Functionality of the processor 210 is discussed more fully below.

The configuration of the UE 200 shown in FIG. 2 is an example and not limiting of the invention, including the claims, and other configurations may be used. For example, an example configuration of the UE includes one or more of the processors 230-234 of the processor 210, the memory 211, and the wireless transceiver 240. Other example configurations include one or more of the processors 230-234 of the processor 210, the memory 211, the wireless transceiver 240, and one or more of the sensor(s) 213, the user interface 216, the SPS receiver 217, the camera 218, the PMD 219, and/or the wired transceiver 250.

The UE 200 may comprise the modem processor 232 that may be capable of performing baseband processing of signals received and down-converted by the transceiver 215 and/or the SPS receiver 217. The modem processor 232 may perform baseband processing of signals to be upconverted for transmission by the transceiver 215. Also or alternatively, baseband processing may be performed by the processor 230 and/or the DSP 231. Other configurations, however, may be used to perform baseband processing.

The UE 200 may include the sensor(s) 213 that may include, for example, an Inertial Measurement Unit (IMU) 270, one or more magnetometers 271, and/or one or more environment sensors 272. The IMU 270 may comprise one or more inertial sensors, for example, one or more accelerometers 273 (e.g., collectively responding to acceleration of the UE 200 in three dimensions) and/or one or more gyroscopes 274. The magnetometer(s) may provide measurements to determine orientation (e.g., relative to magnetic north and/or true north) that may be used for any of a variety of purposes, e.g., to support one or more compass applications. The environment sensor(s) 272 may comprise, for example, one or more temperature sensors, one or more barometric pressure sensors, one or more ambient light sensors, one or more camera imagers, and/or one or more microphones, etc. The sensor(s) 213 may generate analog and/or digital signals indications of which may be stored in the memory 211 and processed by the DSP 231 and/or the processor 230 in support of one or more applications such as, for example, applications directed to positioning and/or navigation operations.

The sensor(s) 213 may be used in relative location measurements, relative location determination, motion determination, etc. Information detected by the sensor(s) 213 may be used for motion detection, relative displacement, dead reckoning, sensor-based location determination, and/or sensor-assisted location determination. The sensor(s) 213 may be useful to determine whether the UE 200 is fixed (stationary) or mobile and/or whether to report certain useful information to the server 120 regarding the mobility of the UE 200. For example, based on the information obtained/measured by the sensor(s) 213, the UE 200 may notify/report to the server 120 that the UE 200 has detected movements or that the UE 200 has moved, and report the relative displacement/distance (e.g., via dead reckoning, or sensor-based location determination, or sensor-assisted location determination enabled by the sensor(s) 213). In another example, for relative positioning information, the sensors/IMU can be used to determine the angle and/or orientation of the other device with respect to the UE 200, etc.

The IMU 270 may be configured to provide measurements about a direction of motion and/or a speed of motion of the UE 200, which may be used in relative location determination. For example, the one or more accelerometers 273 and/or the one or more gyroscopes 274 of the IMU 270 may detect, respectively, a linear acceleration and a speed of rotation of the UE 200. The linear acceleration and speed of rotation measurements of the UE 200 may be integrated over time to determine an instantaneous direction of motion as well as a displacement of the UE 200. The instantaneous direction of motion and the displacement may be integrated to track a location of the UE 200. For example, a reference location of the UE 200 may be determined, e.g., using the SPS receiver 217 (and/or by some other means) for a moment in time and measurements from the accelerometer(s) 273 and gyroscope(s) 274 taken after this moment in time may be used in dead reckoning to determine present location of the UE 200 based on movement (direction and distance) of the UE 200 relative to the reference location.

The magnetometer(s) 271 may determine magnetic field strengths in different directions which may be used to determine orientation of the UE 200. For example, the orientation may be used to provide a digital compass for the UE 200. The magnetometer(s) 271 may include a two-dimensional magnetometer configured to detect and provide indications of magnetic field strength in two orthogonal dimensions. Also or alternatively, the magnetometer(s) 271 may include a three-dimensional magnetometer configured to detect and provide indications of magnetic field strength in three orthogonal dimensions. The magnetometer(s) 271 may provide means for sensing a magnetic field and providing indications of the magnetic field, e.g., to the processor 210. The magnetometer measurements may be used in dead reckoning movement determination, e.g., by allowing the processor 210 to combine orientation with movement to determine direction of the movement. Multiple measurements of movement and orientation may be combined to determine a total movement, i.e., displacement, over a time corresponding to the combined measurements.

The environmental sensor 272, e.g., a barometer, may be used for dead reckoning movement (and possibly location) determination. For example, measurements from the barometer may be used to determine vertical displacement of the UE 105, which may be combined with the other indications of movement. One or more of the other sensor measurements may, however, also provide information regarding vertical displacement. For example, inertial sensor measurements combined with the orientation of the UE 105 may translate into vertical movement whether combined with horizontal movement or not.

The transceiver 215 may include a wireless transceiver 240 and a wired transceiver 250 configured to communicate with other devices through wireless connections and wired connections, respectively. For example, the wireless transceiver 240 may include a transmitter 242 and receiver 244 coupled to one or more antennas 246 for transmitting (e.g., on one or more uplink channels) and/or receiving (e.g., on one or more downlink channels) wireless signals 248. The transmitter 242 may include multiple transmitters that may be discrete components or combined/integrated components, and/or the receiver 244 may include multiple receivers that may be discrete components or combined/integrated components. The wireless transceiver 240 may be configured to communicate signals (e.g., with TRPs and/or one or more other devices) according to a variety of radio access technologies (RATs) such as 5G New Radio (NR), GSM (Global System for Mobiles), UMTS (Universal Mobile Telecommunications System), AMPS (Advanced Mobile Phone System), CDMA (Code Division Multiple Access), WCDMA (Wideband CDMA), LTE (Long-Term Evolution), LTE Direct (LTE-D), 3GPP LTE-V2X (PC5), IEEE 802.11 (including IEEE 802.11p), WiFi, WiFi Direct (WiFi-D), Bluetooth®, Zigbee etc. New Radio may use mm-wave frequencies and/or sub-6 GHz frequencies. The wired transceiver 250 may include a transmitter 252 and a receiver 254 configured for wired communication, e.g., with the network 135 to send communications to, and receive communications from, the gNB 110a, for example. The transmitter 252 may include multiple transmitters that may be discrete components or combined/integrated components, and/or the receiver 254 may include multiple receivers that may be discrete components or combined/integrated components. The wired transceiver 250 may be configured, e.g., for optical communication and/or electrical communication. The transceiver 215 may be communicatively coupled to the transceiver interface 214, e.g., by optical and/or electrical connection. The transceiver interface 214 may be at least partially integrated with the transceiver 215.

The user interface 216 may comprise one or more of several devices such as, for example, a speaker, microphone, display device, vibration device, keyboard, touch screen, etc. The user interface 216 may include more than one of any of these devices. The user interface 216 may be configured to enable a user to interact with one or more applications hosted by the UE 200. For example, the user interface 216 may store indications of analog and/or digital signals in the memory 211 to be processed by DSP 231 and/or the general-purpose processor 230 in response to action from a user. Similarly, applications hosted on the UE 200 may store indications of analog and/or digital signals in the memory 211 to present an output signal to a user. The user interface 216 may include an audio input/output (I/O) device comprising, for example, a speaker, a microphone, digital-to-analog circuitry, analog-to-digital circuitry, an amplifier and/or gain control circuitry (including more than one of any of these devices). Other configurations of an audio I/O device may be used. Also or alternatively, the user interface 216 may comprise one or more touch sensors responsive to touching and/or pressure, e.g., on a keyboard and/or touch screen of the user interface 216.

The SPS receiver 217 (e.g., a Global Positioning System (GPS) receiver) may be capable of receiving and acquiring SPS signals 260 via an SPS antenna 262. The antenna 262 is configured to transduce the wireless signals 260 to wired signals, e.g., electrical or optical signals, and may be integrated with the antenna 246. The SPS receiver 217 may be configured to process, in whole or in part, the acquired SPS signals 260 for estimating a location of the UE 200. For example, the SPS receiver 217 may be configured to determine location of the UE 200 by trilateration using the SPS signals 260. The general-purpose processor 230, the memory 211, the DSP 231 and/or one or more specialized processors (not shown) may be utilized to process acquired SPS signals, in whole or in part, and/or to calculate an estimated location of the UE 200, in conjunction with the SPS receiver 217. The memory 211 may store indications (e.g., measurements) of the SPS signals 260 and/or other signals (e.g., signals acquired from the wireless transceiver 240) for use in performing positioning operations. The general-purpose processor 230, the DSP 231, and/or one or more specialized processors, and/or the memory 211 may provide or support a location engine for use in processing measurements to estimate a location of the UE 200.

The UE 200 may include the camera 218 for capturing still or moving imagery. The camera 218 may comprise, for example, an imaging sensor (e.g., a charge coupled device or a CMOS imager), a lens, analog-to-digital circuitry, frame buffers, etc. Additional processing, conditioning, encoding, and/or compression of signals representing captured images may be performed by the general-purpose processor 230 and/or the DSP 231. Also or alternatively, the video processor 233 may perform conditioning, encoding, compression, and/or manipulation of signals representing captured images. The video processor 233 may decode/decompress stored image data for presentation on a display device (not shown), e.g., of the user interface 216.

The position (motion) device (PMD) 219 may be configured to determine a position and possibly motion of the UE 200. For example, the PMD 219 may communicate with, and/or include some or all of, the SPS receiver 217. The PMD 219 may also or alternatively be configured to determine location of the UE 200 using terrestrial-based signals (e.g., at least some of the signals 248) for trilateration, for assistance with obtaining and using the SPS signals 260, or both. The PMD 219 may be configured to use one or more other techniques (e.g., relying on the UE's self-reported location (e.g., part of the UE's position beacon)) for determining the location of the UE 200, and may use a combination of techniques (e.g., SPS and terrestrial positioning signals) to determine the location of the UE 200. The PMD 219 may include one or more of the sensor(s) 213 (e.g., gyroscope(s), accelerometer(s), magnetometer(s), etc.) that may sense orientation and/or motion of the UE 200 and provide indications thereof that the processor 210 (e.g., the processor 230 and/or the DSP 231) may be configured to use to determine motion (e.g., a velocity vector and/or an acceleration vector) of the UE 200. The PMD 219 may be configured to provide indications of uncertainty and/or error in the determined position and/or motion.

Figure 3:
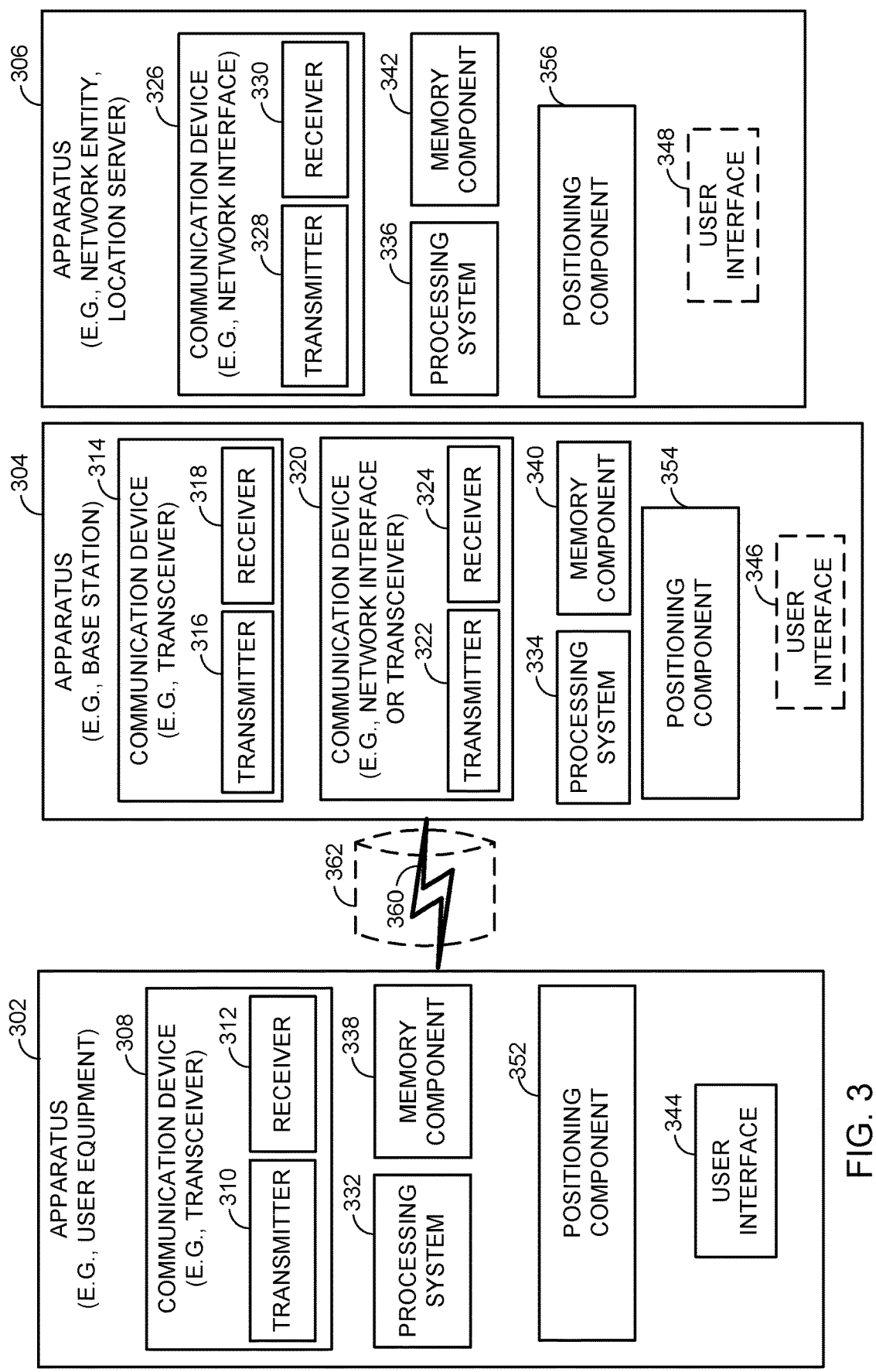
FIG. 3 is a simplified block diagram of several sample aspects of components that may be employed in wireless communication nodes and configured to support communication in accordance with one or more aspects of the disclosure.

Referring to FIG. 3, with further reference to FIGS. 1 and 2, an apparatus 302, an apparatus 304, and an apparatus 306 include sample components shown (represented by corresponding blocks). The apparatus 302, 304, 306 correspond to, for example, a UE, a base station (e.g., eNB, gNB), and a network entity or location server, respectively, to support the operations as disclosed herein. As an example, the apparatus 302 may correspond to the UE 200, the apparatus 304 may correspond to the gNB 110a, 110b and/or the eNB 114, and the apparatus 306 may correspond to the location server 120 (e.g., a Location Management Function (LMF), an Enhanced Serving Mobile Location Center (eSMLC), a Secure User Plane (SUPL) Location Platform (SLP), etc.) or to the Gateway Mobile Location Center (GMLC) 125. The components may be implemented in different types of apparatuses in different implementations (e.g., in an ASIC, in a System-on-Chip (SoC), etc.). The illustrated components may be incorporated into other apparatuses in a communication system. For example, other apparatuses in a system may include components similar to those described to provide similar functionality. A given apparatus may contain one or more of the components. For example, an apparatus may include multiple transceiver components that enable the apparatus to operate on multiple carriers and/or communicate via different technologies.

The apparatus 302 may be an example of the UE 200 shown in FIG. 2. For example, the communication device 308 may comprise the wireless transceiver 240, the processing system 332 may comprise one or more components of the processor 210, the memory component 338 may comprise the memory 211, the positioning component 352 may comprise one or more components of the processor 210 and the memory 211 (and possibly the PMD 219), and the user interface 344 may comprise the user interface 216.

The apparatus 302 and the apparatus 304 each may include at least one wireless communication device (represented by communication devices 308 and 314) for communicating with other nodes via at least one designated RAT (e.g., LTE, 5G NR (New Radio)). The communication device 308 may include at least one transmitter (represented by a transmitter 310) for transmitting and encoding signals (e.g., messages, indications, information, and so on) and at least one receiver (represented by a receiver 312) for receiving and decoding signals (e.g., messages, indications, information, pilots, and so on). The communication device 308 may comprise the wireless transceiver 240 shown in FIG. 2, with the transmitter 310 comprising the transmitter 242 and the receiver 312 comprising the receiver 244. The receiver 312 may also be configured to measure received signals, e.g., wireless signals, to determine signal measurements. The received signals may be positioning signals (e.g., PRS signals, SPS signals, etc.) or other types of signals, e.g., communication signals. For example, the receiver 312 may be part of the SPS receiver 217 configured to receive and process SPS signals. The transmitter 310 and the receiver 312 may be collectively referred to as a transceiver. The communication device 314 may include at least one transmitter (represented by a transmitter 316) for transmitting signals (e.g., messages, indications, information, pilots, and so on) and at least one receiver (represented by a receiver 318) for receiving signals (e.g., messages, indications, information, and so on). The transmitter 316 and the receiver 318 may be collectively referred to as a transceiver.

A transmitter and a receiver may comprise an integrated device (e.g., embodied as a transmitter circuit and a receiver circuit of a single communication device), may comprise a separate transmitter device and a separate receiver device, or may be embodied in other ways. A transmitter may include a plurality of antennas, such as an antenna array, that permits the respective apparatus to perform transmit "beamforming" as described further herein. Similarly, a receiver may include a plurality of antennas, such as an antenna array, that permits the respective apparatus to perform receive beamforming as described further herein. The transmitter and receiver may share the same plurality of antennas and may only receive or transmit at a given time, not both at the same time. A wireless communication device (e.g., one of multiple wireless communication devices) of the apparatus 304 may comprise a Network Listen Module (NLM) or the like for performing various measurements.

The apparatus 304 and the apparatus 306 each may include at least one communication device (represented by a communication device 320 and a communication device 326) for communicating with other nodes. For example, the communication device 326 may comprise a network interface (e.g., one or more network access ports) configured to communicate with one or more network entities via a wire-based or wireless backhaul connection. The communication device 326 may be implemented as a transceiver configured to support wire-based or wireless signal communication. This communication may involve, for example, sending and receiving messages, parameters, or other types of information. In the example of FIG. 3, the communication device 326 comprises a transmitter 328 and a receiver 330 (e.g., network access ports for transmitting and receiving). The transmitter 328 and the receiver 330 may be collectively referred to as a transceiver. The communication device 320 may comprise a network interface that is configured to communicate with one or more network entities via a wire-based and/or a wireless backhaul. As with the communication device 326, the communication device 320 is shown comprising a transmitter 322 and a receiver 324, which may be collectively referred to as a transceiver.

One or more of the apparatuses 302, 304, 306 may include one or more other components used in conjunction with the operations as disclosed herein. For example, the apparatus 302 may include a processing system 332 for providing functionality relating to, for example, RTT measurements in a licensed or unlicensed frequency band as disclosed herein and/or for providing other processing functionality. The apparatus 304 may include a processing system 334 for providing functionality relating to, for example, RTT measurements in a licensed or unlicensed frequency band as disclosed herein and/or for providing other processing functionality. The apparatus 306 may include a processing system 336 for providing functionality relating to, for example, RTT measurements in a licensed or unlicensed frequency band as disclosed herein and/or for providing other processing functionality. Each of the processing systems 332, 334, 336 may be referred to as a processor, and may include, for example, one or more general purpose processors, multi-core processors, ASICs, digital signal processors (DSPs), field programmable gate arrays (FPGA), or one or more other programmable logic devices or processing circuitry.

The apparatuses 302, 304, and 306 may include memory components 338, 340, and 342 (e.g., each including a memory device), respectively, for maintaining information (e.g., information indicative of reserved resources, thresholds, parameters, and so on). The memories 338, 340, 342 may comprise non-transitory, processor-readable storage mediums storing processor-readable instructions that are configured to cause (e.g., may be executed (after compilation as appropriate) to cause) the processors 332, 334, 336 to perform functions discussed herein. The apparatuses 302, 304, and 306 may include user interface devices 344, 346, and 348, respectively, for providing indications (e.g., audible and/or visual indications) to a user and/or for receiving user input (e.g., upon user actuation of a sensing device such as a keypad, a touch screen, a microphone, and so on).

For convenience, the apparatuses 302, 304, and/or 306 are shown in FIG. 3 as including various components that may be configured according to various examples described herein. The illustrated blocks may, however, have different functionality in different designs.

Components of FIG. 3 may be implemented in various ways. For example, components of FIG. 3 may be implemented in one or more circuits such as, for example, one or more processors and/or one or more ASICs (which may include one or more processors). Each circuit may use and/or incorporate at least one memory component for storing information or executable code (including instructions) used by the circuit to provide desired functionality. For example, at least some of the functionality represented by, and/or discussed with respect to, blocks 308, 332, 338, and 344 may be implemented by processor and/or memory component(s) of the apparatus 302 (e.g., by execution of appropriate code and/or by appropriate configuration of processor components). Similarly, at least some of the functionality represented by blocks 314, 320, 334, 340, and 346 may be implemented by processor and memory component(s) of the apparatus 304 (e.g., by execution of appropriate code and/or by appropriate configuration of processor components). Similarly, at least some of the functionality represented by blocks 326, 336, 342, and 348 may be implemented by processor and memory component(s) of the apparatus 306 (e.g., by execution of appropriate code and/or by appropriate configuration of processor components).

The apparatus 304 may correspond to a "small cell" or a Home gNodeB. The apparatus 302 may transmit and receive messages via a wireless link 360 with the apparatus 304, the messages including information related to various types of communication (e.g., voice, data, multimedia services, associated control signaling, etc.). The wireless link 360 may operate over a communication medium of interest, shown by way of example in FIG. 3 as a medium 362, which may be shared with other communication links as well as other RATs. A medium of this type may be composed of one or more of frequency, time, and/or space communication resources (e.g., encompassing one or more channels across one or more carriers) associated with communication between one or more transmitter/receiver pairs, such as the apparatus 304 and the apparatus 302 for the medium 362.

As a particular example, the medium 362 may correspond to at least a portion of an unlicensed frequency band shared with another RAN and/or one or more APs and/or one or more UEs. The apparatus 302 and the apparatus 304 may operate via the wireless link 360 according to one or more radio access types, such as LTE, LTE-U, or 5G NR, depending on the network in which they are deployed. These networks may include, for example, different variants of CDMA networks (e.g., LTE networks, 5G NR networks, etc.), TDMA networks, FDMA networks, Orthogonal FDMA (OFDMA) networks, Single-Carrier FDMA (SC-FDMA) networks, and so on. Although different licensed frequency bands have been reserved for wireless communications (e.g., by a government entity such as the Federal Communications Commission (FCC) in the United States), certain communication networks, in particular those employing small-cell base stations, have extended operation into unlicensed frequency bands, such as the Unlicensed National Information Infrastructure (U-NII) band used by WLAN technologies, most notably IEEE 802.11x WLAN technologies generally referred to as "Wi-Fi," and LTE in unlicensed spectrum technologies generally referred to as "LTE-U" or "MuLTEFire."

The apparatus 302 may include a positioning component 352 that may be used to obtain location-related measurements of signals (e.g., OTDOA, RTT, etc.) transmitted by a base station or AP (e.g., the gNB 110a, 110b or the ng-eNB 114) according to techniques described herein. Location-related measurements may include measurements of signal propagation time or RTT between a UE (e.g., the UE 105) and a base station or AP (e.g., the gNB 110a, 110b, the ng-eNB 114, etc.). The apparatus may send measurement information to the apparatus 306, e.g., directly or via the apparatus 304.

The apparatus 306 may store and/or process measurement information received from the apparatus 302 (and/or other apparatus 302). For example, the apparatus 306 may aggregate measurement information from one or more of the apparatus 302 and send some or all of the aggregated information to one or more of the apparatus 302 (even to apparatus 302 that did not provide measurement information). As another example, the apparatus may send a subset of the aggregated measurement information, e.g., the portion of the aggregated measurement information that is most relevant to the receiving apparatus 302 (e.g., based on capabilities of the apparatus 302, location, time, etc.). As another example, the apparatus 306 may process the measurement information and/or the aggregated measurement information. For example, the apparatus 306 may process the (aggregated) measurement information to determine a machine-learning classifier to enable the apparatus 306 to predict the content of a feature vector, e.g., based on capabilities of an apparatus 302, time, date, etc. As another example, the apparatus 306 may process the (aggregated) measurement information to determine various mathematical results such as averages, standard deviation, etc. The apparatus 306 may group the (aggregated) measurement information based on various criteria, e.g., capabilities of apparatus 302, time, day, etc. before processing.

The apparatus 304, 306 may include positioning components 354, 356, respectively, which may be used to determine a location estimate for the UE 105 (e.g., the apparatus 302), according to techniques described herein, based on location-related measurements provided by the UE 105 and/or by a base station or AP, such as any of the base stations 110a, 110b, 114. Location-related measurements obtained by the UE 105 may include measurements of signal propagation time or RTT between the UE 105 and a base station or AP, such as any of such as any of the base stations 110a, 110b, 114. Location-related measurements obtained by a base station or AP such as any of the base stations 110a, 110b, 114 (e.g., apparatus 304) may include measurements of signal propagation time or RTT between the UE 105 and the base station or AP.

A position estimate (e.g., for the UE 105) may be referred to by other names, such as a location estimate, location, position, position fix, fix, or the like. A position estimate may be geodetic and comprise coordinates (e.g., latitude, longitude, and possibly altitude) or may be civic and comprise a street address, postal address, or some other description of a location. A position estimate may be defined relative to some other known location or defined in absolute terms (e.g., using latitude, longitude, and possibly altitude). A position estimate may include an expected error or uncertainty (e.g., by including an area or volume within which the location is expected to be included with some specified or default level of confidence).

For terrestrial positioning of a UE in cellular networks, techniques such as Advanced Forward Link Trilateration (AFLT) and Observed Time Difference Of Arrival (OTDOA) often operate in "UE-assisted" mode in which measurements of reference signals (e.g., PRS, CRS, etc.) transmitted by base stations are taken by the UE and then provided to a location server. The location server then calculates the position of the UE based on the measurements and known locations of the base stations. Because these techniques use the location server to calculate the position of the UE, rather than the UE itself, these positioning techniques are not frequently used in applications such as car or cell-phone navigation, which instead typically rely on satellite-based positioning.

A UE may use a Satellite Positioning System (SPS) (a Global Navigation Satellite System (GNSS)) for high-accuracy positioning using precise point positioning (PPP) or real time kinematic (RTK) technology. These technologies use assistance data such as measurements from ground-based stations. LTE Release 15 allows the data to be encrypted so that only the UEs subscribed to the service can read the information. Such assistance data varies with time. Thus, a UE subscribed to the service may not easily "break encryption" for other UEs by passing on the data to other UEs that have not paid for the subscription. The passing on would need to be repeated every time the assistance data changes.

In UE-assisted positioning, the UE sends measurements (e.g., TDOA, Angle of Arrival (AoA), etc.) to the positioning server (e.g., LMF/eSMLC). The positioning server has the base station almanac (BSA) that contains multiple 'entries' or 'records', one record per cell, where each record contains geographical cell location but also may include other data. An identifier of the 'record' among the multiple 'records' in the BSA may be referenced. The BSA and the measurements from the UE may be used to compute the position of the UE.

In conventional UE-based positioning, a UE computes its own position, thus avoiding sending measurements to the network (e.g., location server), which in turn improves latency and scalability. The UE uses relevant BSA record information (e.g., locations of gNBs (more broadly base stations)) from the network. The BSA information may be encrypted. But since the BSA information varies much less often than, for example, the PPP or RTK assistance data described earlier, it may be easier to make the BSA information (compared to the PPP or RTK information) available to UEs that did not subscribe and pay for decryption keys. Transmissions of reference signals by the gNBs make BSA information potentially accessible to crowd-sourcing or wardriving, essentially enabling BSA information to be generated based on in-the-field and/or over-the-top observations.

One or more of many different techniques may be used to determine position of an entity such as the UE 105. For example, known position-determination techniques include RTT, multi-RTT, OTDOA (also called TDOA and including UL-TDOA and DL-TDOA), Enhanced Cell Identification (E-CID), DL-AoD, UL-AoA, etc. RTT uses a time for a signal to travel from one entity to another and back to determine a range between the two entities. The range, plus a known location of a first one of the entities and an angle between the two entities (e.g., an azimuth angle) can be used to determine a location of the second of the entities. In multi-RTT, multiple ranges from one entity to other entities and known locations of the other entities may be used to determine the location of the one entity. In TDOA techniques, the difference in travel times between one entity and other entities may be used to determine relative ranges from the other entities and those, combined with known locations of the other entities may be used to determine the location of the one entity. Angles of arrival and/or departure may be used to help determine location of an entity. For example, an angle of arrival or an angle of departure of a signal combined with a range between devices (determined using signal, e.g., a travel time of the signal, a received power of the signal, etc.) and a known location of one of the devices may be used to determine a location of the other device. The angle of arrival or departure may be an azimuth angle relative to a reference direction such as true north. The angle of arrival or departure may be a zenith angle relative to directly upward from an entity (i.e., relative to radially outward from a center of Earth). E-CID uses the identity of a serving cell, the timing advance (i.e., the difference between receive and transmit times at the UE), estimated timing and power of detected neighbor cell signals, and possibly angle of arrival (e.g., of a signal at the UE from the base station or vice versa) to determine location of the UE. In TDOA, the difference in arrival times at a receiving device of signals from different sources along with known locations of the sources and known offset of transmission times from the sources are used to determine the location of the receiving device.

In a network-centric RTT estimation, the serving base station (e.g., the base station 110a) instructs the UE (e.g., the UE 105) to scan for/receive RTT measurement signals (e.g., PRS) on serving cells of two or more neighboring base stations (and typically the serving base station, as at least three base stations are needed). The one of more base stations transmit RTT measurement signals on low reuse resources (e.g., resources used by the base station to transmit system information) allocated by the network (e.g., a location server such as the Location Management Function (LMF) 120). The UE records the arrival time (also referred to as a receive time, a reception time, a time of reception, or a time of arrival (ToA)) of each RTT measurement signal relative to the UE's current downlink timing (e.g., as derived by the UE from a DL signal received from its serving base station), and transmits a common or individual RTT response message (e.g., SRS (sounding reference signal), UL-PRS) to the one or more base stations (e.g., when instructed by its serving base station) and may include the time difference $T_{Rx \rightarrow Tx}$ (or UE $T_{Rx-Tx}$) between the ToA of the RTT measurement signal and the transmission time of the RTT response message in a payload of each RTT response message. The RTT response message would include a reference signal from which the base station can deduce the ToA of the RTT response. By comparing the difference $T_{Rx \rightarrow Tx}$ between the transmission time of the RTT measurement signal from the base station and the ToA of the RTT response at the base station to the UE-reported time difference $T_{Rx \rightarrow Tx}$, the base station can deduce the propagation time between the base station and the UE, from which the base station can determine the distance between the UE and the base station by assuming the speed of light during this propagation time.

A UE-centric RTT estimation is similar to the network-based method, except that the UE transmits uplink RTT measurement signal(s) (e.g., when instructed by a serving base station), which are received by multiple base stations in the neighborhood of the UE. Each involved base station responds with a downlink RTT response message, which may include the time difference between the ToA of the RTT measurement signal at the base station and the transmission time of the RTT response message from the base station in the RTT response message payload.

For both network-centric and UE-centric procedures, the side (network or UE) that performs the RTT calculation typically (though not always) transmits the first message(s) or signal(s) (e.g., RTT measurement signal(s)), while the other side responds with one or more RTT response message(s) or signal(s) that may include the difference between the ToA of the first message(s) or signal(s) and the transmission time of the RTT response message(s) or signal(s).

A multi-RTT technique may be used to determine position. For example, a first entity (e.g., a UE) may send out one or more signals (e.g., unicast, multicast, or broadcast from the base station) and multiple second entities (e.g., other TSPs such as base station(s) and/or UE(s)) may receive a signal from the first entity and respond to this received signal. The first entity receives the responses from the multiple second entities. The first entity (or another entity such as an LMF) may use the responses from the second entities to determine ranges to the second entities and may use the multiple ranges and known locations of the second entities to determine the location of the first entity by trilateration.

In some instances, additional information may be obtained in the form of an angle of arrival (AoA) or angle of departure (AoD) that defines a straight line direction (e.g., which may be in a horizontal plane or in three dimensions) or possibly a range of directions (e.g., for the UE 105 from the location of a base station). The intersection of the two directions at or near the point (x, y) can provide another estimate of the location for the UE 105.

Multipath Determination of Positioning Signals

Figure 4A:
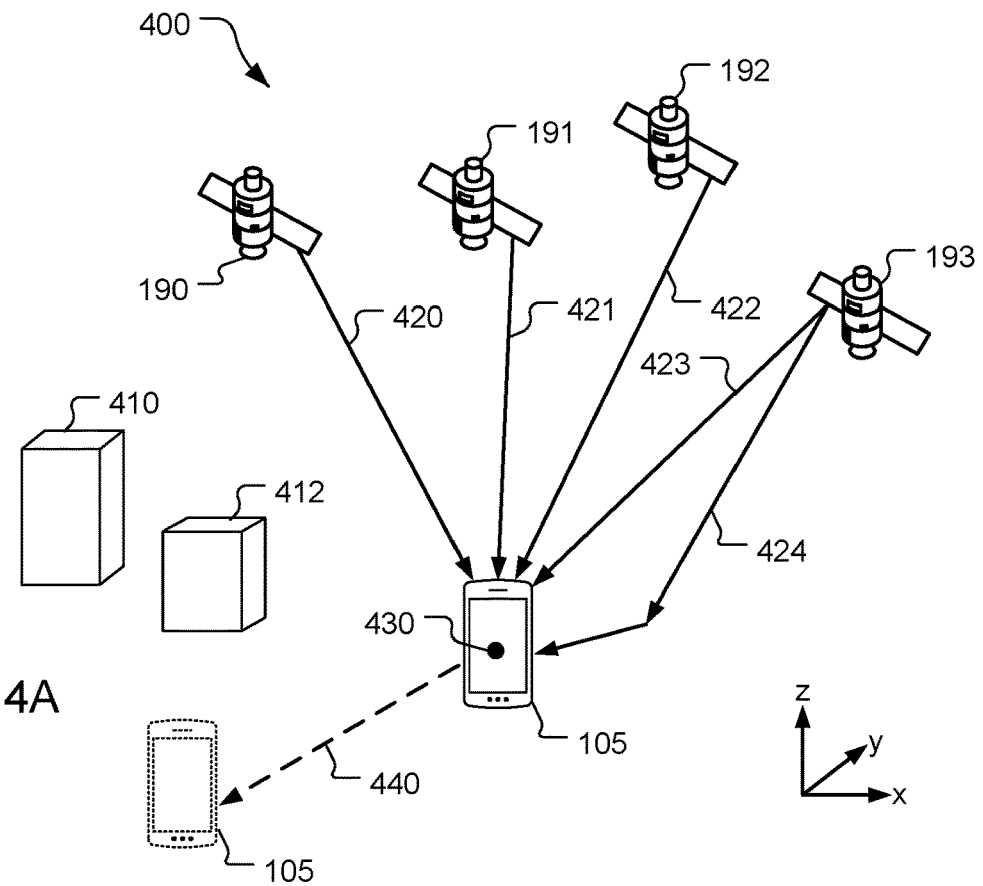
FIG. 4A is a simplified diagram of satellites and a UE shown in FIG. 1 with the UE in a first position.

Referring also to FIG. 4A, an environment 400 includes the UE 105, the satellites 190-193, and buildings 410, 412. While the discussion herein focuses on the SVs 190-193 as positioning signal sources, other positioning signal sources, e.g., base stations such as the gNBs 110a, 110b, and/or the ng-eNB 114, and/or other base stations, may be used. The UE 105 is disposed to receive positioning signals 420, 421, 422, 423, 424 from the SVs 190-193, respectively. As shown, the positioning signals 420-423 are received directly from the SVs 190-193 while the positioning signal 424 is a multipath signal. In this example, while the UE 105 is in line of sight (LOS) with the SV 193, the signal 424 reflects off of a surface, e.g., the ground, before being received by the UE 105. The signal 424 is an example of LOS multipath (i.e., a multipath signal despite the transmitter (here, the SV 193) and the receiver (here, the UE 105) being in LOS and thus capable of receiving a non-multipath signal, e.g., the signal 423.

The UE 105 is configured to measure the positioning signals 420-424 and determine measured ranges from the UE 105 to the SVs 190-193, respectively. The antenna 262 may receive the signals 420-424 and the SPS receiver 217 (possibly in conjunction with the processor 210 and the memory 211 (e.g., the software 212)) may process the signals 420-424 to determine positioning signal measurements (e.g., time of travel from the respective SVs 190-193 to the UE 105). The UE 105 may determine measured ranges from the UE 105 to the SVs 190-193 based on the positioning signal measurements. The multipath signal 424 will result in the determined time of travel being longer than the time of travel of the signal 423, and thus the determined range being longer than the actual range from the UE to the SV 193. The UE 105 (e.g., the SPS receiver 217 (possibly in conjunction with the processor 210 and the memory 211 (e.g., the software 212))) may combine the measurements of the signals 423, 424, e.g., averaging the signals, or averaging the determined ranges, to determine a combined (e.g., averaged) range from the UE 105 to the SV 193.

The UE 105 is configured to determine a location of the UE 105 using sets of measured ranges. The UE 105 (e.g., the SPS receiver 217 and/or the processor 210 (possibly in combination with the memory 211) may perform a trilateration process using the ranges determined to the SVs 190-193 to determine the location of the UE 105. While the UE 105 may be moving, and thus the signals 420-424 may not be measured while the UE 105 is at exactly the same location, the trilateration process may provide a single point as the location of the UE 105. The trilateration process may provide an area (e.g., a point plus some uncertainty) and a point within the area (e.g., a center of a symmetrical area) may be selected as the location of the UE 105. Here, the UE 105 may be assumed to be at a location 430 in FIG. 4. As the UE 105 may be mobile, as indicated by a displacement vector 440, the UE 105 may move to a new location and determine the location of the UE 105 based on positioning signal measurements of positioning signals received while at the new location.

Figure 4B:
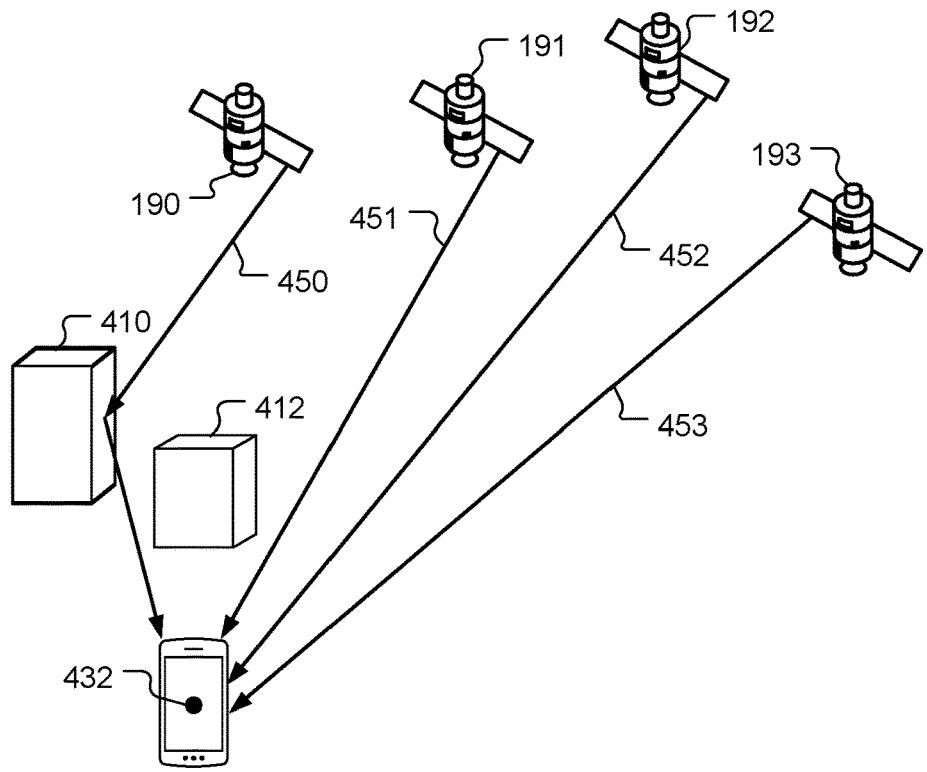
FIG. 4B is a simplified diagram of the satellites and the UE shown in FIG. 1 with the UE having moved to a second position as indicated in FIG. 4A.

Referring also to FIG. 4B, the UE 105 has moved to a new location 432, different from the location 430 shown in FIG. 4A. The UE 105 may measure positioning signals 450, 451, 452, 453 from the SVs 190-193, respectively, for use in determining the location of the UE 105. In this example, the location 432 is such that the UE 105 is no longer in line of sight with the SV 190, i.e., the UE 105 is in non-line of sight (NLOS) with the SV 190. Thus, the only positioning signal that the UE 105 receives from the SV 190 is the multipath positioning signal 450. It is undesirable to use multipath signals for location determination (position determination) as the path taken by the multipath signal is longer than the actual separation of the transmitter and receiver, and thus the determined range is longer than the actual range. If the determined range is assumed to be the actual range and used in the trilateration process, then the determined location of the UE 105 may be inaccurate, possibly unacceptably inaccurate (e.g., depending upon the application/use of the determined location).

The UE 105 may determine a displacement of the UE 105 between the location 430 and the location 432. For example, the UE 105 may determine the displacement using dead reckoning by processing one or more sensor measurements provided by one or more of the sensor(s) 213 as discussed above and using known techniques. Also or alternatively, the UE 105 may determine displacement using one or more other techniques using one or more other types of information. For example, the UE 105 may determine displacement using images captured by the camera 218. The processor 210 may analyze multiple images, possibly combined with orientation information of the UE 105, to determine magnitude and/or direction of movement of the UE 105. For example, the UE 105 may use the locations of one or more objects in multiple images and sizes of the objects in the images to determine movement of the UE 105 relative to the object(s).

The UE 105 may determine whether a positioning signal is a multipath signal. For example, the UE 105 may be configured to determine whether a positioning signal based on a range to the source of the positioning signal compared to an expected range to the source based on a previous range and a displacement of the UE 105 since measurement of the positioning signal yielding the previous range. The UE 105 may determine an expected range (e.g., a projected pseudorange) to a positioning signal source by adjusting a previously-determined range, determined from a previously-measured positioning signal, by the displacement of the UE 105 since measurement of the previously-measured positioning signal. The UE 105 may add the displacement vector to the previously-determined range, with or without knowledge of direction between the UE 105 and the positioning signal source. Also or alternatively, the UE 105 may determine an expected range by determining an expected location by adding a displacement vector of the UE 105 to a previously-determined position of the UE 105, with the displacement vector being the net magnitude and direction of the UE 105 since measurement of the positioning signals that resulted in the determination of the previously-determined position (location) of the UE 105. The UE may determine that a presently-determined range and/or a previously determined range corresponds to a multipath signal if the expected range to a positioning signal source differs from a measured (e.g., presently-measured) range to the positioning signal source by more than a threshold amount, which may be called a range threshold.

The UE 105 (e.g., the processor 210, possibly in combination with the memory 211) may determine that at least a presently-measured positioning signal is a multipath signal if the range corresponding to the presently-measured positioning signal exceeds the expected range by more than a range threshold. If a previously-measured positioning signal is received directly (e.g., the signal 420 from the SV 190), but a newly-measured positioning signal from the same positioning signal source (e.g., the signal 450 from the SV 190) is received by multipath transmission, then an expected range determined using the directly-received (non-multipath) signal and the displacement of the UE 105 may be much shorter than the range corresponding to the multipath signal. In this case, the expected range may reflect the actual separation of the UE 105 and the positioning signal source (e.g., the SV 190) accurately, and thus the measured range may exceed the expected range by about the amount of extra distance traveled by the multipath signal (e.g., the signal 450) compared to a direct transmission. The difference (delta) may differ from the extra distance, e.g., if the expected range is determined using a previously-determined location that was determined using one or more multipath signals, due to errors in displacement calculation, etc.

The UE 105 (e.g., the processor 210, possibly in combination with the memory 211) may determine that at least a previously-measured positioning signal is a multipath signal if the range corresponding to the presently-measured positioning signal is smaller than the expected range by more than a range threshold (which may be different than the threshold for determining that the presently-measured positioning signal is a multipath signal). If a previously-measured positioning signal is received by multipath transmission (e.g., the signal 424 from the SV 193), but a newly-measured positioning signal from the same positioning signal source (e.g., the signal 453 from the SV 190) is received directly, then an expected range determined using the multipath signal (even if combined with a directly-received signal from the same source, e.g., the signal 423) and the displacement of the UE 105 may be much longer than the range corresponding to the directly-received signal. In this case, the expected range may reflect a range that is longer than the actual separation of the UE 105 and the positioning signal source (e.g., the SV 193) accurately, and thus the measured range may be less than the expected range by about the amount of extra distance traveled by the multipath signal (e.g., the signal 424, or the average extra distance of the combined multipath signal 424 and directly-received signal 423) compared to a direct transmission. The difference (delta) may differ from the extra distance, e.g., if the expected range is determined using a previously-determined location that was determined using one or more multipath signals, due to errors in displacement calculation, etc.

The UE 105 may be configured to discount a measured range to a positioning signal source if the corresponding positioning signal has been determined to be (e.g., identified as) a multipath signal. The UE 105 may discount (e.g., de-weight or reject) a range that defies expectations. For example, the UE 105 may weight the range less in a trilateration process that uses ranges from the UE 105 to multiple positioning sources to determine the location of the UE 105. As another example of discounting a measured range, the UE 105 may not use the measured range at all in the trilateration process for a measured range where the corresponding positioning signal is identified as a multipath signal. That is, the UE 105 may omit (exclude) a measured range, determined to have been derived from a multipath signal, from the trilateration process. The UE 105 may discard the measured range to exclude the measured range from any (further) use. Discounting ranges determined using multipath signals may help improve location determination accuracy by discounting erroneous information and thus increasing the percentage of accurate information upon which the location is determined. The UE 105 may also be configured to discount a signal received in the future from a signal source whose past signal was determined to be a multipath signal. Thus, once a signal from a source, e.g., an SV, is determined to be multipath, future signals from that source may be discounted, at least for use in determining location of the UE 105. This future discounting may be limited based on one or more factors, e.g., time (e.g., discounting discontinued in response to passage of a threshold amount of time), location (e.g., discounting discontinued in response to movement of the UE 105 by more than a threshold distance), and/or reliability of the signal (e.g., if a future signal from the source is determined to be a line-of-sight signal).

Figure 5A:
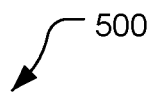
FIG. 5A is a table of measured ranges, displacement vectors, expected ranges, and measured and expected range differences for the UE moving from the first to the second positions shown in FIGS. 4A and 4B.

Referring also to FIG. 5A, a table 500 includes values of measured ranges, displacement vectors between UE positions, expected range, and differences between measured and expected ranges. In FIG. 5A, all values are given in meters and are example values for illustration only. The UE, e.g., the SPS receiver 217 and possibly the processor 210, can determine measured ranges at the positions 430, 432 by measuring positioning signals from the SVs 190-193 (and/or other SVs, and/or other types of positioning signal sources). The UE 105, e.g., the PMD 219 and/or the processor 210 in conjunction with one or more of the sensor(s) 213 and/or the camera 218, may determine a displacement vector of the UE 105 since being at the position 430. For example, measurements of the sensor(s) 213 and/or the camera 218 may be synchronized with the SPS receiver 217 such that the UE 105 may determine displacement since measuring positioning signals resulting in a location determination, e.g., since measuring SV signals from the SVs 190-193 resulting in determination of the position 430. Thus, the displacement vectors shown in FIG. 5A are latitude, longitude, and altitude displacement from a reference point, e.g., the position 430 determined from SV signals. The UE 105 may determine an expected range at the position 432 by determining the range at the position 430, determining the displacement vector from the position 430 to the position 432, and calculating a net effect on the measured range from the position 430 of the displacement vector (considering magnitude and direction of movement of the UE 105, movement of the respective SV 190-193, and direction from the position 430 to the respective SV 190-193). The UE 105 may measure positioning signals while at the position 432 (realizing that there may be some movement of the UE 105 between measurements, and the calculated position 432 may be a single point or a range of points (e.g., a three-dimensional volume)). For sake of simplicity and illustration, a singled calculated position 432 is assumed. In this example, the UE 105 determines that a delta (difference) between the expected range and the measured range for the SVs 191, 192 is zero, the delta for the SV 190 is 43m, and the delta for the SV 193 is −13m. For a range threshold of 10m, the UE 105 may conclude that the positioning signal 450 received from the SV 190 is a multipath signal because the measured range exceeded the expected range by more than the range threshold. Similarly, the UE 105 may conclude that the positioning signal 424 (or a combination of the signals 423, 424) received from the SV 193 was a multipath signal because the measured range is smaller than the expected range by more than the range threshold.

Figure 5B:
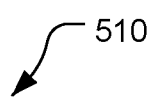
FIG. 5B is a table of measured ranges, displacement magnitudes, and expected windows, and measured and expected range differences, for the UE moving from the first to the second positions shown in FIGS. 4A and 4B.

Referring also to FIG. 5B, a table 510 includes values of measured ranges, displacement magnitudes between UE positions, expected range, and differences between measured and expected ranges. In this example, with displacement magnitude determined instead of displacement vectors, the expected ranges are windows of distance corresponding to the measured ranges for the position 430 plus or minus the displacement magnitude. The UE 105 may determine whether the measured range for the position 432 is within the expected range window or not, and if not, whether the measured range exceeds the expected range window or is less than the expected range window. The UE 105 may conclude that a signal was multipath if the delta outside the expected range window. In this example, the UE 105 determines that the measured range for each of the SVs 190-193 is within the expected range window and thus may not conclude that any of the positioning signals was multipath.

Figure 6:
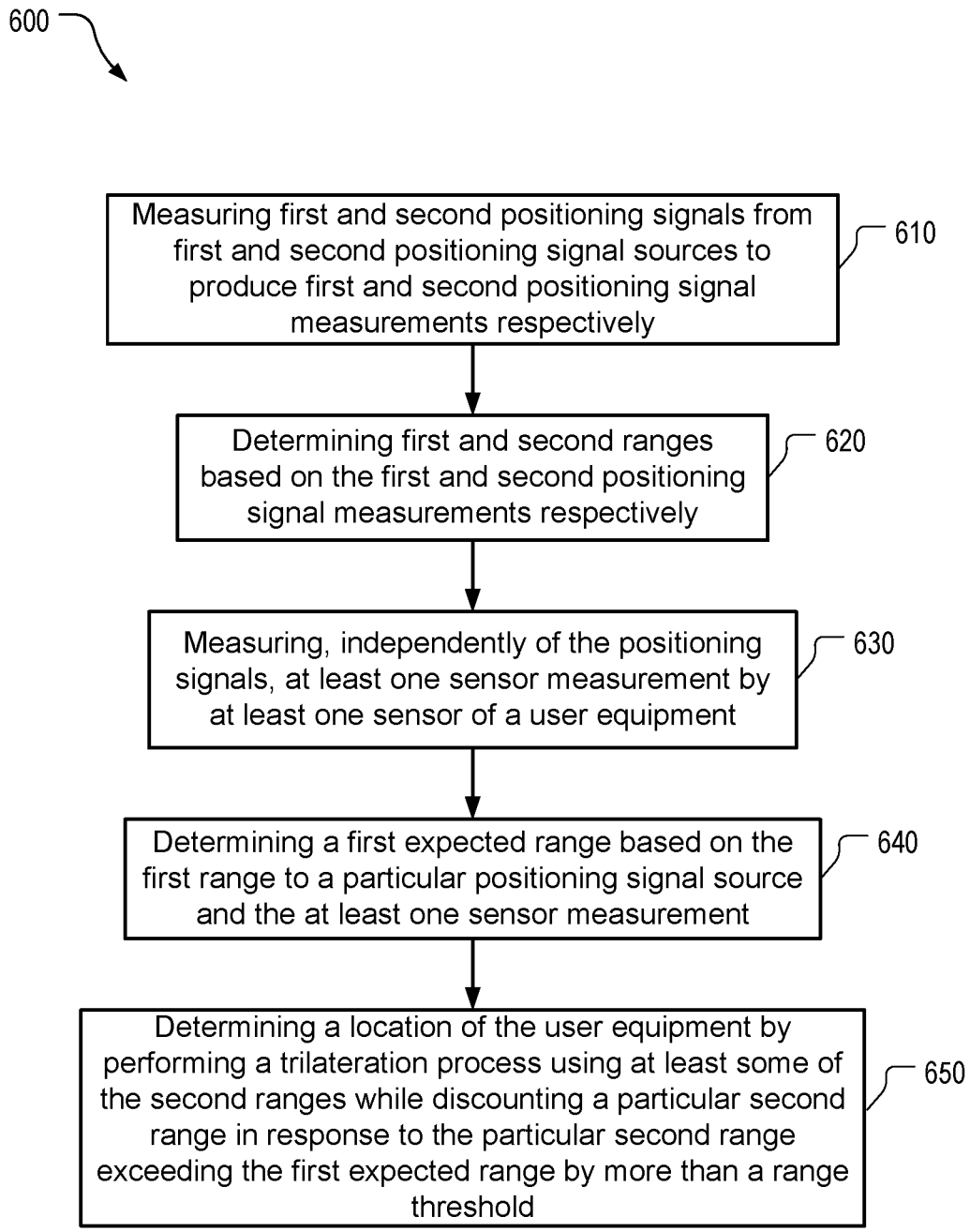
FIG. 6 is a block flow diagram of a positioning method.
Figure 7:
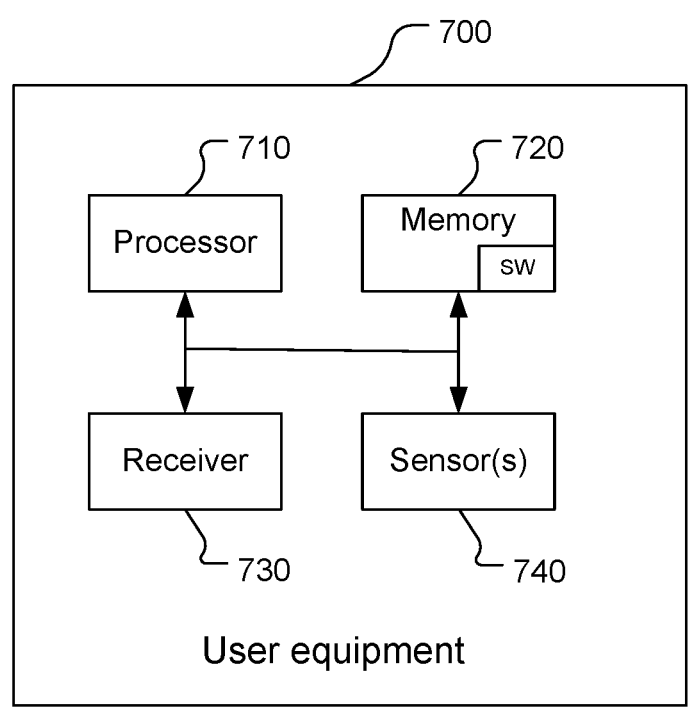
FIG. 7 is a block diagram of an example user equipment for performing at least portions of the method shown in FIG. 6.

Referring to FIG. 6, with further reference to FIGS. 1-5 and FIG. 7, a method 600 of determining a location of a user equipment includes the stages shown. The method 600 is, however, an example only and not limiting. The order of the stages shown in FIG. 600 is not a required order of performance of the stages. The method 600 may be altered, e.g., by having stages added, removed, rearranged, combined, performed concurrently, and/or having single stages split into multiple stages. Still other alterations to the method 600 as shown and described may be possible. The method may be implemented, at least partially, by a user equipment 700 shown in FIG. 7. The UE 700 is an example of the UE 200 shown in FIG. 2, which is an example of the UE 700 shown in FIG. 1. The UE 700 includes a processor 710, a memory 720, a receiver 730, and one or more sensors 740. The processor 710 may include, for example, the general purpose/application processor 230 and/or the DSP 231 and/or one or more other components. The receiver 730 may include the SPS receiver 217 (and possibly the antenna 262) and/or the wireless receiver 244 (and possibly the antenna 246) and/or the wired receiver 254). For example, the receiver 730 may include components for receiving signals and producing signal measurements, e.g., components such as an antenna, and analog-to-digital converter, a comparator, and a processor (and appropriate memory). The sensor(s) 740 may include one or more of the sensors 213 and/or the camera 218 (which may include multiple cameras) and/or one or more other sensors. The processor 710 is communicatively coupled to the memory 720, the receiver 730, and the sensor(s) 740.

At stage 610, the method 600 includes measuring first and second positioning signals from first and second positioning signal sources to produce first and second positioning signal measurements, respectively. For example, the receiver 730, or the processor 710 (possibly the memory 720), or a combination thereof may measure first positioning signals with the UE 700 at the first position 430 and second positioning signals with the UE 700 at the second position 432. The receiver 730 may receive one or more positioning signals from one or more SVs and/or one or more terrestrial base stations and/or one or more other positioning signal sources. The receiver 730 and/or the processor 710 (possibly the memory 720) may comprise means for measuring first positioning signals and means for measuring second positioning signals to produce first and second positioning signal measurements.

At stage 620, the method 600 includes determining first and second ranges based on the first and second positioning signal measurements respectively. For example, the processor 710 (possibly in conjunction with the memory 720) may determine ranges based on determined time of flight of the positioning signals from the positioning signal sources (e.g., one or more of the SVs 190-193 and/or one or more base stations and/or one or more other positioning signal sources) to the UE 700. The processor 710 possibly in conjunction with the memory 720 may comprise means for determining first ranges based on the first positioning signal measurements and means for determining second ranges based on the second positioning signal measurements. In the examples shown in FIGS. 4A, 4B, the range determined based on the signal 424, or a combination of the signals 423, 424, and the range determined based on the signal 450, will be erroneously long due to the multipath route taken by the signals 424, 450.

At stage 630, the method 600 includes measuring, independently of the positioning signals, at least one sensor measurement by at least one sensor of the user equipment. For example, one or more of the sensor(s) 740 and/or one or more other sensors, possibly in conjunction with the processor 710 (and possibly the memory 720) may be used to measure information from which motion of the UE 700 may be determined. The at least one sensor measurement may include one or more inertial measurements and/or one or more images and/or one or more magnetic field measurements, etc. The UE 700 may obtain positioning signal information for determining motion of the UE 700 in addition to measuring at least sensor measurement independent of positioning signal information. The UE 700 may obtain at least some sensor information without using a positioning signal to do so. The UE 700 may determine displacement magnitude or a displacement vector (magnitude and direction) which may be in the form of determining coordinates of movement, e.g., north, east, and upward movement amounts, without calculating magnitude and angle of movement. One or more of the sensor(s) 740 and/or one or more other sensors, possibly in conjunction with the processor 710 (and possibly the memory 720), may comprise means for measuring, independently of the positioning signals, at least one sensor measurement.

At stage 640, the method 600 includes determining a first expected range based on the first range to a particular positioning signal source and the at least one sensor measurement. For example, the processor 710, possibly in conjunction with the memory 720, calculates an expected range by determining a net effect of the movement of the UE 700 on the range to the particular positioning signal source, e.g., using knowledge of the first range (magnitude) and direction of the separation of the UE 700 and the positioning signal source and the motion of the UE 700 determined from the at least one sensor measurement. The UE 700 may also use knowledge of movement, if any, of the positioning signal source, e.g., from ephemeris data for the particular one of the SVs 190-193. The processor 710, possibly in conjunction with the memory 720, may comprise means for determining the first expected range.

At stage 650, the method 600 includes determining a location of the user equipment by performing a trilateration process using at least some of the second ranges while discounting a particular second range in response to the particular second range exceeding the first expected range by more than a range threshold. For example, the processor 710 (possibly in conjunction with the memory 720) may reduce a weight (and thus an influence or effect) of the particular second range for the trilateration process, or omit the particular second range from the trilateration process, to determine the location of the UE 700 using the second ranges. Thus, for any positioning signal source to which multiple ranges are determined, if the latter-determined range exceeds an expected range (based on prior-determined range and/or location and movement of the UE 700 determined from measurement(s) independent of positioning signals) by more than a threshold amount, the latter-determined range may be discounted because the positioning signal(s) on which the latter-determined range is based is determined to be or include a multipath signal. The processor 710 possibly in conjunction with the memory 720 may comprise means for determining the location of the UE.

The method 600 may include one or more other features. For example, the method 600 may include determining a location of the user equipment using the trilateration process with at least some of the first ranges while discounting a selected first range of one of the positioning signal sources in response to a second range corresponding to the positioning signal source of the selected first range being smaller than the expected range for that positioning signal source by more than a range threshold. The method 600 may include replacing a previously-determined location of the user equipment, that was determined using the selected first range undiscounted (without discounting), with the newly-determined location determined while discounting the selected first range. In this way, previously-determined locations may be iterated to improve the accuracy of the determined location, which may be used for a variety of purposes (e.g., device tracking, determining present location based on previous location and dead reckoning, etc.). The processor 710, possibly in conjunction with the memory 720, may comprise means for determining the location of the UE using the first ranges and/or means for replacing a previously-determined location of the UE.

Figure 8:
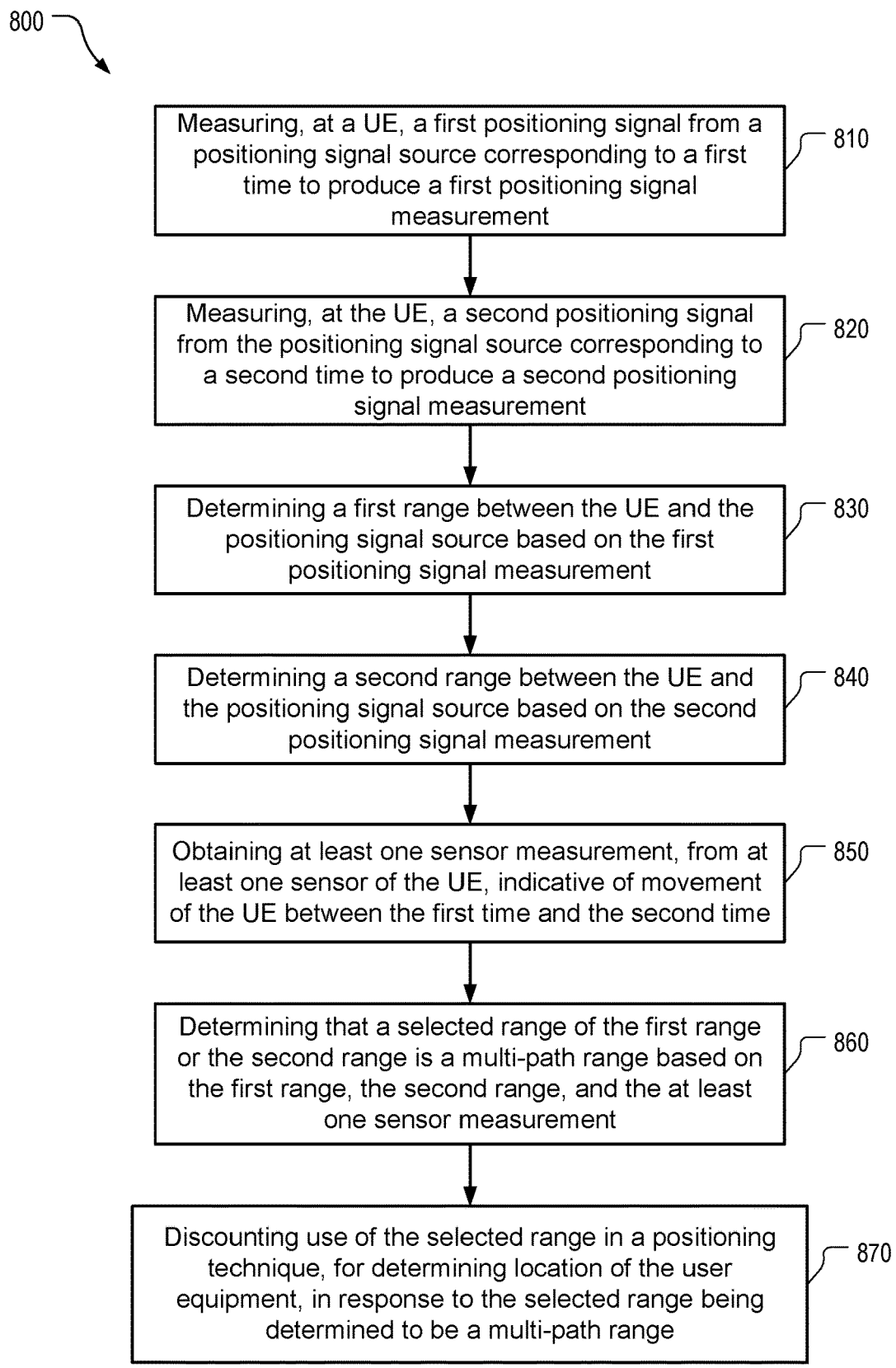
FIG. 8 is a block flow diagram of a method of assisting a positioning technique.

Referring to FIG. 8, with further reference to FIGS. 1-7, a method 800 of assisting a positioning technique includes the stages shown. The method 800 is, however, an example only and not limiting. The order of the stages shown in FIG. 800 is not a required order of performance of the stages. The method 800 may be altered, e.g., by having stages added, removed, rearranged, combined, performed concurrently, and/or having single stages split into multiple stages. Still other alterations to the method 800 as shown and described may be possible. The method may be implemented, at least partially, by the UE 700 shown in FIG. 7.

At stage 810, the method 800 includes measuring, at a user equipment (UE), a first positioning signal from a positioning signal source corresponding to a first time to produce a first positioning signal measurement. For example, the receiver 730, or the processor 710 (possibly the memory 720), or a combination thereof may measure a first positioning signal with the UE 700 at the first position 430 at a first time. The receiver 730 may receive one or more positioning signals from one or more SVs and/or one or more terrestrial base stations and/or one or more other positioning signal sources. The receiver 730 and/or the processor 710 (possibly the memory 720) may comprise means for measuring the first positioning signal to produce a first positioning signal measurement.

At stage 820, the method 800 includes measuring, at the UE, a second positioning signal from the positioning signal source corresponding to a second time to produce a second positioning signal measurement. For example, the receiver 730, or the processor 710 (possibly the memory 720), or a combination thereof may measure a second positioning signal with the UE 700 at the second position 432 at a second time. The second positioning signal may be the same signal as the first positioning signal but sent at a different time than (before or after) the first positioning signal. For example, the first positioning signal may be the signal 424 and the second positioning signal may be the signal 45. As another example, the first positioning signal may be the signal 420 and the second positioning signal may be the signal 450. The receiver 730 and/or the processor 710 (possibly the memory 720) may comprise means for measuring the second positioning signal to produce a second positioning signal measurement.

At stage 830, the method 800 includes determining a first range between the UE and the positioning signal source based on the first positioning signal measurement. For example, the processor 710, possibly in conjunction with the memory 720, calculates a range from the signal source, e.g., one of the SVs 190-193, using the first positioning signal measurement. The processor 710 may determine a pseudorange based on a time of flight of the signal, e.g., the signal 420 or the signal 424. The processor 710, possibly in conjunction with the memory 720, may comprise means for determining the first range.

At stage 840, the method 800 includes determining a second range between the UE and the positioning signal source based on the second positioning signal measurement. For example, the processor 710, possibly in conjunction with the memory 720, calculates a range from the signal source, e.g., one of the SVs 190-193, using the second positioning signal measurement. The processor 710 may determine a pseudorange based on a time of flight of the signal, e.g., the signal 450 or the signal 453. The processor 710, possibly in conjunction with the memory 720, may comprise means for determining the first range.

At stage 850, the method 800 includes obtaining at least one sensor measurement, from at least one sensor of the UE, indicative of movement of the UE between the first time and the second time. For example, one or more of the sensor(s) 740 and/or one or more other sensors, possibly in conjunction with the processor 710 (and possibly the memory 720) may be used to measure information from which motion of the UE 700 may be determined. The at least one sensor measurement may be information from which displacement may be determined, or may be (an indication of) the displacement itself. The at least one sensor measurement may include one or more inertial measurements and/or one or more images and/or one or more magnetic field measurements, etc. The UE 700 may obtain positioning signal information for determining motion of the UE 700 in addition to measuring at least sensor measurement independent of positioning signal information. The UE 700 may obtain at least some sensor information without using a positioning signal to do so. The UE 700 may determine displacement magnitude or a displacement vector (magnitude and direction) which may be in the form of determining coordinates of movement, e.g., north, east, and upward movement amounts, without calculating magnitude and angle of movement. One or more of the sensor(s) 740 and/or one or more other sensors, possibly in conjunction with the processor 710 (and possibly the memory 720), may comprise means for obtaining at least one sensor measurement.

At stage 860, the method 800 includes determining that a selected range of the first range or the second range is a multipath range based on the first range, the second range, and the at least one sensor measurement. For example, the processor 710, possibly in conjunction with the memory 720, may calculate an expected range by determining a net effect of the movement of the UE 700 on the range to the particular positioning signal source, e.g., using knowledge of the first range (magnitude), and displacement of the UE 700 between the first time and the second time. The UE 700 may also use knowledge of movement, if any, of the positioning signal source, e.g., from ephemeris data for the particular one of the SVs 190-193, between the first and second times. The processor 710 may determine whether the expected range differs from the second range enough to indicate that at least one of the first range or the second range is a multipath range, i.e., corresponds to a multipath signal. For example, if the expected range exceeds the second range by more than a range threshold, then the UE 700 may determine that at least the previous positioning signal from that source was a multipath signal. If the expected range (e.g., based on the signal 420 and the displacement vector 440 (or magnitude thereof)) is shorter than the present measured range (e.g., based on the signal 450) by more than the range threshold, then the UE may determine that at least the present positioning signal is a multipath signal. If the expected range (e.g., based on the signal 424 and the displacement vector 440 (or magnitude thereof)) is longer than the present measured range by more than the range threshold, then the UE may determine that at least the previous positioning signal was a multipath signal. As another example, the processor 710 may compare a difference between the first range and the second range to the displacement of the UE 700 between the first time and the second time. If the difference in the ranges differs from the displacement by more than a threshold amount, then the processor 710 may conclude that at least one of the ranges is a multipath range. The processor 710 may be configured to use different thresholds for the displacement being less than the range difference versus more than the range difference. Similarly, the processor 710 may be configured to use different thresholds for the expected range being less than the second range (or the second range being more than the expected range) versus more than the second range (or second range being less than the expected range). A threshold may be relative (e.g., a percentage of the difference between the first and second ranges or the expected range and the second range) or absolute (e.g., a distance such as a number of meters). The processor 710, possibly in conjunction with the memory 720, may comprise means for determining whether a selected range of the first range or the second range is a multipath range.

At stage 870, the method 800 includes discounting use of the selected range in a positioning technique, for determining location of the user equipment, in response to the selected range being determined to be a multipath range. For example, the processor 710 (possibly in conjunction with the memory 720) may reduce a weighting (and thus an influence or effect) of the selected range for a trilateration process, or omit (exclude) the selected range from the trilateration process, to determine the location of the UE 700 (e.g., for UE-based positioning). As another example, the processor 710 may exclude the selected range from use by another entity (e.g., the apparatus 306 such as a location server) by not sending the range (or information from which the range may be determined) to the other entity (e.g., for UE-assisted positioning). As another example, the processor 710 may de-weight use of the selected range use by another entity by sending an de-weighting indication (e.g., a weighting factor with a value less than one) along with the selected range (or information from which the range may be determined) to the other entity. The processor 710 may discount both first range and the second range (possibly resulting in re-determination of a location of the UE 700). The processor 710 possibly in conjunction with the memory 720 may comprise means for determining the location of the UE.

The method 800 may include one or more other features. For example, determining that the selected range is a multipath range comprise: determining that an expected range differs from the second range by more than a first threshold amount, the expected range being based on the first range and a displacement of the UE between the first time and the second time, the displacement being based on the at least one sensor measurement; and/or determining that a difference between the first range and the second range exceeds the displacement of the UE between the first time and the second time by more than a second threshold amount. For example, the processor 710 may determine that a range is a multipath range by determining and comparing an expected range to the second range and/or determining a range difference compared to movement of the UE 700. The processor 710 may determine a magnitude or a magnitude and direction of the movement to determine whether the selected range is a multipath range. As another example, the method 800 may include determining a presently-determined location of the UE in accordance with the positioning technique with the selected range discounted, and replacing a previously-determined location of the UE with the presently-determined location of the UE. For example, the processor 710 may be configured such that if the processor 710 determines and stores a location of the UE 700 based on a range that is later determined to be a multipath range, then the processor 710 may re-determine the location with the multipath range discounted (e.g., de-weighted or excluded), and may replace the previously-determined location (based on the undiscounted multipath range) with the re-determined location. The processor 710, possibly in conjunction with the memory 720, may comprise means for determining a presently-determined location of the UE and means for replacing a previously-determined location of the UE with the presently-determined location. The method 800 may include discounting use of a third positioning signal measurement of a third positioning signal from the positioning signal source, for determining another location of the UE, in response to the selected range being determined to be a multipath range. For example, the processor 710 may respond to determining that the signal 450 from the SV 190 is a multipath signal by discounting use of at least one signal later received from the SV 190 for determining location of the UE 700. The processor 710 may stop or reduce the discounting, e.g., in response to passage of a threshold amount of time, in response to movement of the UE 700 by more than a threshold distance, in response to determining that a later-received signal from the SV 190 is a line-of-sight signal, or in response to another condition, or in response to a combination of two or more of these conditions. The processor 710, possibly in conjunction with the memory 720, may comprise means for discounting use of the third positioning signal measurement.

OTHER CONSIDERATIONS

Having described several example configurations, other examples or implementations including various modifications, alternative constructions, and equivalents may be used without departing from the spirit of the disclosure. For example, due to the nature of software and computers, functions described above can be implemented using software executed by a processor, hardware, firmware, hardwiring, or a combination of any of these. Features implementing functions may also be physically located at various positions, including being distributed such that portions of functions are implemented at different physical locations. Elements discussed may be components of a larger system, wherein other rules may take precedence over or otherwise modify the application of the invention. Also, a number of operations may be undertaken before, during, or after above-discussed elements or operations are considered. Accordingly, the above description does not bound the scope of the claims.

As used herein, the singular forms "a," "an," and "the" include the plural forms as well, unless the context clearly indicates otherwise. The terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

As used herein, "or" as used in a list of items prefaced by "at least one of" or prefaced by "one or more of" indicates a disjunctive list such that, for example, a list of "at least one of A, B, or C," or a list of "one or more of A, B, or C," or "A, B, or C, or a combination thereof" means A or B or C or AB or AC or BC or ABC (i.e., A and B and C), or combinations with more than one feature (e.g., AA, AAB, ABBC, etc.).

As used herein, unless otherwise stated, a statement that a function or operation is "based on" an item or condition means that the function or operation is based on the stated item or condition and may be based on one or more items and/or conditions in addition to the stated item or condition.

Further, an indication that information is sent or transmitted, or a statement of sending or transmitting information, "to" an entity does not require completion of the communication. Such indications or statements include situations where the information is conveyed from a sending entity but does not reach an intended recipient of the information. The intended recipient, even if not actually receiving the information, may still be referred to as a receiving entity, e.g., a receiving execution environment. Further, an entity that is configured to send or transmit information "to" an intended recipient is not required to be configured to complete the delivery of the information to the intended recipient. For example, the entity may provide the information, with an indication of the intended recipient, to another entity that is capable of forwarding the information along with an indication of the intended recipient.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

The terms "processor-readable medium," "machine-readable medium," and "computer-readable medium," or the like as used herein, refer to any medium that participates in providing data that causes a machine to operate in a specific fashion. Using a computer system, various computer-readable media might be involved in providing instructions/code to processor(s) for execution and/or might be used to store and/or carry such instructions/code (e.g., as signals). In many implementations, a computer-readable medium is a physical and/or tangible storage medium. Such a medium may take many forms, including but not limited to, non-volatile media and volatile media. Non-volatile media include, for example, optical and/or magnetic disks. Volatile media include, without limitation, dynamic memory.

Common forms of physical and/or tangible computer-readable media include, for example, hard disk, magnetic tape, or any other magnetic medium, a CD-ROM, any other optical medium, a RAM, a PROM, EPROM, a FLASH-EPROM, any other memory chip or cartridge, or any other medium from which a computer can read instructions and/or code.

The methods, systems, and devices discussed above are examples. Various configurations may omit, substitute, or add various procedures or components as appropriate. For instance, in alternative configurations, the methods may be performed in an order different from that described, and that various steps may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations provides a description for implementing described techniques. Various changes may be made in the function and arrangement of elements without departing from the spirit or scope of the disclosure.

Also, configurations may be described as a process which is depicted as a flow diagram or block diagram. Although each may describe the operations as a sequential process, some operations may be performed in parallel or concurrently. In addition, the order of the operations may be rearranged. A process may have additional stages or functions not included in the figure. Furthermore, examples of the methods may be implemented by hardware, software, firmware, middleware, microcode, hardware description languages, or any combination thereof. When implemented in software, firmware, middleware, or microcode, the program code or code segments to perform the tasks may be stored in a non-transitory computer-readable medium such as a storage medium. Processors may perform one or more of the described tasks.

Components, functional or otherwise, shown in the figures and/or discussed herein as being connected or communicating with each other are communicatively coupled unless otherwise noted. That is, they may be directly or indirectly connected to enable communication between them.

A statement that a value exceeds (or is more than or above) a threshold value (e.g., a first threshold value) is equivalent to a statement that the value meets or exceeds another threshold value (e.g., a second threshold value) that is slightly greater than the first threshold value, e.g., the second threshold value being one value higher than the first threshold value in the resolution of a computing system. A statement that a value is less than (or is within or below) a threshold value (e.g., first threshold value) is equivalent to a statement that the value is less than or equal to another threshold value (e.g., a second threshold value) that is slightly lower than the first threshold value, e.g., the second threshold value being one value lower than the first threshold value in the resolution of a computing system.

The invention claimed is:

1. A user equipment (UE) comprising:
a receiver configured to receive positioning signals;
at least one sensor configured to provide at least one sensor measurement independent of the positioning signals;
a memory; and
a processor communicatively coupled to the receiver, the memory, and the at least one sensor,
the processor being configured to:
determine a first range between the UE and a positioning signal source based on a first positioning signal measurement of a first positioning signal from the positioning signal source corresponding to a first time;
determine a second range between the UE and the positioning signal source based on a second positioning signal measurement of a second positioning signal from the positioning signal source corresponding to a second time;

determine whether a selected range of the first range or the second range is a multipath range based on the first range, the second range, and movement of the UE between the first time and the second time indicated by the at least one sensor measurement, wherein to determine whether the selected range is a multipath range the processor is:
  configured to determine whether an expected range differs from the second range by more than a first threshold amount, the expected range being based on the first range and a displacement of the UE between the first time and the second time, the displacement being based on the at least one sensor measurement being used to determine that the first or second positioning signal, or the previous positioning signal, was a multipath signal; or
  configured to determine whether a difference between the first range and the second range exceeds a displacement of the UE between the first time and the second time by more than a second threshold amount; and
  discount use of the selected range in a positioning technique, for
  determining location of the UE, in response to the selected range being determined to be a multipath range.

2. The UE of claim 1, wherein to determine whether the selected multipath range the processor is configured to determine a magnitude of the displacement of the UE based on the at least one sensor measurement.

3. The UE of claim 1, wherein to determine whether the selected multipath range the processor is configured to determine a magnitude of the displacement of the UE based on the at least one sensor measurement.

4. The UE of claim 1, wherein the at least one sensor comprises one or more inertial motion sensors.

5. The UE of claim 1, wherein:
  the at least one sensor comprises at least one camera and the at least one sensor measurement comprises a plurality of images captured by the at least one camera; or
  the at least one sensor comprises at least one magnetometer and the at least one sensor measurement comprises one or more magnetic field measurements; or
  a combination thereof.

6. The UE of claim 1, wherein to discount use of the selected range in the positioning technique the processor is at least one of:
  configured to exclude use of the selected range in the positioning technique; or
  configured to reduce a weighting of the selected range in the positioning technique.

7. The UE of claim 1, wherein the processor is configured to:
  determine a presently-determined location of the UE in accordance with the positioning technique with the selected range discounted; and
  replace a previously-determined location of the UE with the presently-determined location of the UE.

8. The UE of claim 1, wherein the processor is further configured to discount use of a third positioning signal measurement of a third positioning signal from the positioning signal source, for determining another location of the UE, in response to the selected range being determined to be a multipath range.

9. A method of assisting a positioning technique, the method comprising:
  measuring, at a user equipment (UE), a first positioning signal from a positioning signal source corresponding to a first time to produce a first positioning signal measurement;
  measuring, at the UE, a second positioning signal from the positioning signal source corresponding to a second time to produce a second positioning signal measurement;
  determining a first range between the UE and the positioning signal source based on the first positioning signal measurement;
  determining a second range between the UE and the positioning signal source based on the second positioning signal measurement;
  obtaining at least one sensor measurement, from at least one sensor of the UE, indicative of movement of the UE between the first time and the second time;
  determining that a selected range of the first range or the second range is a multipath range based on the first range, the second range, and the at least one sensor measurement,
  wherein determining that the selected range is a multipath range comprises at least one of:
    determining that an expected range differs from the second range by more than a first threshold amount, the expected range being based on the first range and a displacement of the UE between the first time and the second time, the displacement being based on the at least one sensor measurement being used to determine that the first or second positioning signal, or the previous positioning signal, was a multipath signal; or
    determining that a difference between the first range and the second range exceeds a displacement of the UE between the first time and the second time by more than a second threshold amount; and
  discounting use of the selected range in the positioning technique, for determining location of the UE, in response to the selected range being determined to be a multipath range.

10. The method of claim 9, wherein determining that the selected range is a multipath range comprises determining a magnitude of the displacement of the UE based on the at least one sensor measurement.

11. The method of claim 9, wherein determining that the selected range is a multipath range comprises determining a direction of the displacement of the UE based on the at least one sensor measurement.

12. The method of claim 9, wherein discounting use of the selected range in the positioning technique comprises at least one of:
  excluding use of the selected range in the positioning technique; or
  reducing a weighting of the selected range in the positioning technique.

13. The method of claim 9, further comprising:
  determining a presently-determined location of the UE in accordance with the positioning technique with the selected range discounted; and
  replacing a previously-determined location of the UE with the presently-determined location of the UE.

14. A user equipment (UE) comprising:
  means for measuring a first positioning signal from a positioning signal source corresponding to a first time to produce a first positioning signal measurement;

means for measuring a second positioning signal from the positioning signal source corresponding to a second time to produce a second positioning signal measurement;

means for determining a first range between the UE and the positioning signal source based on the first positioning signal measurement;

means for determining a second range between the UE and the positioning signal source based on the second positioning signal measurement;

means for obtaining at least one sensor measurement, from at least one sensor of the UE indicative of movement of the UE between the first time and the second time;

means for determining whether a selected range of the first range or the second range is a multipath range based on the first range, the second range, and the at least one sensor measurement, wherein the means for determining whether the selected range is a multipath range comprise at least one of:

means for determining whether an expected range differs from the second range by more than a first threshold amount, the expected range being based on the first range and a displacement of the UE between the first time and the second time, the displacement being based on the at least one sensor measurement being used to determine that the first or second positioning signal, or the previous positioning signal, was a multipath signal; or means for determining whether a difference between the first range and the second range exceeds a displacement of the UE between the first time and the second time by more than a second threshold amount; and means for discounting use of the selected range in a positioning technique, for determining location of the UE, in response to the selected range being determined to be a multipath range.

15. The UE of claim 14, wherein the means for determining whether the selected range is a multipath range comprise means for determining a magnitude of the displacement of the UE based on the at least one sensor measurement.

16. The UE of claim 14,
wherein the means for determining whether the selected range is a multipath range comprise means for determining a direction of the displacement of the UE based on the at least one sensor measurement.

17. The UE of claim 14, wherein the means for obtaining the at least one sensor measurement comprise one or more inertial motion measurements.

18. The UE of claim 14, wherein the means for obtaining the at least one sensor measurement comprise:
at least one camera of the UE; or
at least one magnetometer; or
a combination thereof.

19. The UE of claim 14, wherein the means for discounting use of the selected range in the positioning technique comprise at least one of:
means for excluding use of the selected range in the positioning technique; or
means for reducing a weighting of the selected range in the positioning technique.

20. The UE of claim 14, further comprising:
means for determining a presently-determined location of the UE in accordance with the positioning technique with the selected range discounted; and means for replacing a previously-determined location of the UE with the presently-determined location of the UE.

21. The UE of claim 14, further comprising means for discounting use of a third positioning signal measurement of a third positioning signal from the positioning signal source, for determining another location of the UE, in response to the selected range being determined to be a multipath range.

22. A non-transitory, processor-readable storage medium comprising instructions configured to cause one or more processors to:

determine a first range between a user equipment (UE) and a positioning signal source based on a first positioning signal measurement at the UE of a first positioning signal from the positioning signal source corresponding to a first time;

determine a second range between the UE and the positioning signal source based on a second positioning signal measurement at the UE of a second positioning signal from the positioning signal source corresponding to a second time;

obtain at least one sensor measurement, from at least one sensor of the UE, indicative of movement of the UE between the first time and the second time;

determine whether a selected range of the first range or the second range is a multipath range based on the first range, the second range, and the at least one sensor measurement, wherein the instructions are configured to cause the one or more processors to determine whether the selected range is a multipath range comprise at least one of:

instructions configured to cause the one or more processors to determine whether an expected range differs from the second range by more than a first threshold amount, the expected range being based on the first range and a displacement of the UE between the first time and the second time, the displacement being based on the at least one sensor measurement being used to determine that the first or second positioning signal, or the previous positioning signal, was a multipath signal; or instructions configured to cause the one or more processors to determine whether a difference between the first range and the second range exceeds a displacement of the UE between the first time and the second time by more than a second threshold amount; and discount use of the selected range in a positioning technique, for determining location of the UE, in response to the selected range being determined to be a multipath range.

23. The storage medium of claim 22,
wherein the instructions are configured to cause the one or more processors to determine whether the selected range is a multipath range comprise instructions configured to cause the one or more processors to determine a magnitude of the displacement of the UE based on the at least one sensor measurement.

24. The storage medium of claim 22,
wherein the instructions are configured to cause the one or more processors to determine whether the selected range is a multipath range comprise instructions configured to cause the one or more processors to determine a direction of the displacement of the UE based on the at least one sensor measurement.

25. The storage medium of claim 22, wherein the instructions are configured to cause the one or more processors to discount use of the selected range in the positioning technique comprise at least one of:
- instructions configured to cause the one or more processors to exclude use of the selected range in the positioning technique; or
- instructions configured to cause the one or more processors to reduce a weighting of the selected range in the positioning technique.

26. The storage medium of claim 22, wherein the instructions are configured to cause the one or more processors to discount use of a third positioning signal measurement of a third positioning signal from the positioning signal source, for determining another location of the UE, in response to the selected range being determined to be a multipath range.

* * * * *